(12) United States Patent
Sugiyama et al.

(10) Patent No.: US 7,193,197 B2
(45) Date of Patent: Mar. 20, 2007

(54) LIGHT DETECTION DEVICE, IMAGING DEVICE AND DISTANT IMAGE ACQUISITION DEVICE

(75) Inventors: Yukinobu Sugiyama, Hamamatsu (JP); Haruyoshi Toyoda, Hamamatsu (JP); Naohisa Mukozaka, Hamamatsu (JP); Seiichiro Mizuno, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 224 days.

(21) Appl. No.: 10/472,142

(22) PCT Filed: Dec. 5, 2002

(86) PCT No.: PCT/JP02/12770

§ 371 (c)(1),
(2), (4) Date: Sep. 22, 2003

(87) PCT Pub. No.: WO03/049190

PCT Pub. Date: Jun. 12, 2003

(65) Prior Publication Data
US 2004/0195490 A1  Oct. 7, 2004

(30) Foreign Application Priority Data
Dec. 5, 2001 (JP) ............................. 2001-371753
Mar. 8, 2002 (JP) ............................. 2002-64000

(51) Int. Cl.
  *H01L 27/00* (2006.01)
  *H01L 31/00* (2006.01)
  *H04N 5/217* (2006.01)
  *H04N 3/14* (2006.01)

(52) U.S. Cl. .............................. 250/208.1; 250/214.1; 348/241; 348/308

(58) Field of Classification Search ............. 250/208.1, 250/214.1; 348/302, 304, 307, 309, 310, 348/290, 308, 241, 278; 257/465, 443
See application file for complete search history.

(56) References Cited

U.S. PATENT DOCUMENTS 5,196,929 A   3/1993  Miyasaka (Continued)

FOREIGN PATENT DOCUMENTS

JP   63-266871   11/1988

(Continued)

*Primary Examiner*—Georgia Epps
*Assistant Examiner*—Don Williams
(74) *Attorney, Agent, or Firm*—Drinker Biddle & Reath LLP

(57) ABSTRACT

A photosensitive region includes a semiconductor substrate 40 made of a P-type semiconductor, and N-type semiconductor regions 41 and 42 formed on the surface of the semiconductor substrate 40. Accordingly, each photosensitive portion includes a portion of the semiconductor substrate 40 and a pair of the regions 41 and 42, thus configuring a photodiode. Each of the regions 41 and 42 is in a shape of an approximate triangle, and is formed so that one side of the regions 41 is adjacent to one side of the region 42, and vice versa, in one pixel. A first wire 44 is for electrically connecting the regions 41 on one side in each pixel across a first direction, and is provided extending in the first direction between the pixels. The second wire 47 is for electrically connecting the regions 47 on the other side in each pixel across a second direction, and is provided extending in the second direction between the pixels.

26 Claims, 23 Drawing Sheets

U.S. PATENT DOCUMENTS

| | | | |
|---|---|---|---|
| 5,602,415 A * | 2/1997 | Kubo et al. ................. 257/443 |
| 5,886,343 A | 3/1999 | Miyawaki et al. |
| 6,091,449 A | 7/2000 | Matsunaga et al. |
| 6,384,396 B1 * | 5/2002 | Mizuno et al. .......... 250/208.1 |
| 6,410,900 B1 | 6/2002 | Okamoto |
| 6,559,433 B1 | 5/2003 | Ozawa |
| 6,956,605 B1 * | 10/2005 | Hashimoto .................. 348/301 |
| 2003/0081132 A1 * | 5/2003 | Kuno et al. .............. 348/222.1 |
| 2004/0129992 A1 * | 7/2004 | Shibayama ................ 257/443 |

FOREIGN PATENT DOCUMENTS

| | | |
|---|---|---|
| JP | 4-277984 | 10/1992 |
| JP | 5-284282 | 10/1993 |
| JP | 8-111821 | 4/1996 |
| JP | 2000-196054 | 7/2000 |
| JP | 2000-196811 | 7/2000 |
| JP | 2000-196812 | 7/2000 |
| JP | 2000-295635 | 10/2000 |
| JP | 2001-36128 | 2/2001 |
| JP | 2000-298177 | 10/2001 |
| JP | 2001-285885 | 10/2001 |

* cited by examiner

ΦHst

ΦH1

ΦH2

ΦHreset shift(H1)

shift(H2)

shift(HM-1)

shift(HM)

Hout

ΦVst

ΦV1

ΦV2

ΦVreset shift(V1)

shift(V2)

shift(VN-1)

shift(VN)

Vout

Fig.23A ΦHst
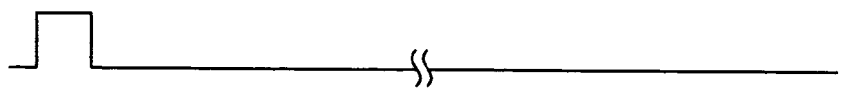
Fig.23B ΦH1
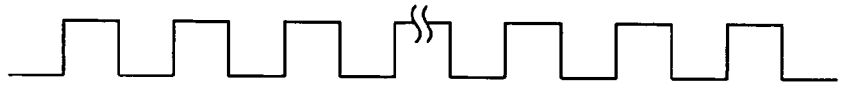
Fig.23C ΦH2
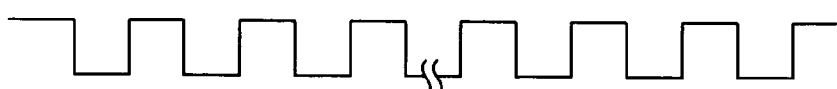
Fig.23D ΦHreset
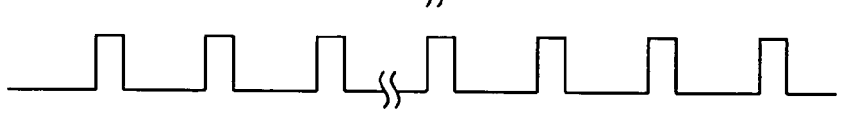
Fig.23E shift(H1)
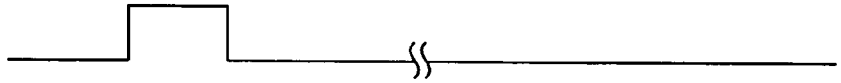
Fig.23F shift(H2)
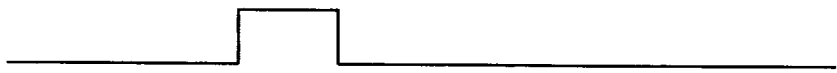
Fig.23G shift(H5)
Fig.23H shift(H6)
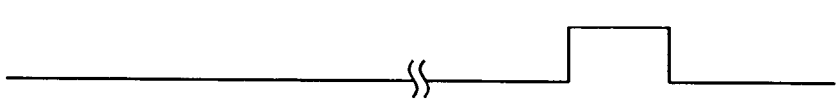
Fig.23I H1out
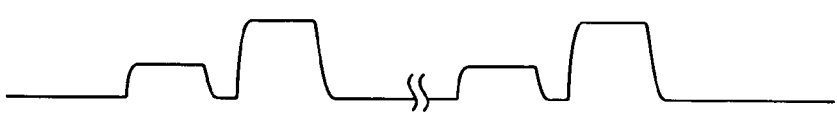
Fig.23J H2out

Fig.24A ΦVst
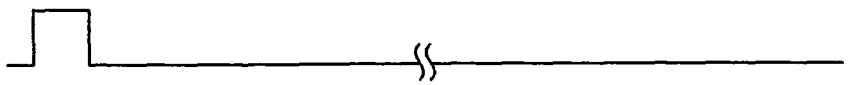
Fig.24B ΦV1
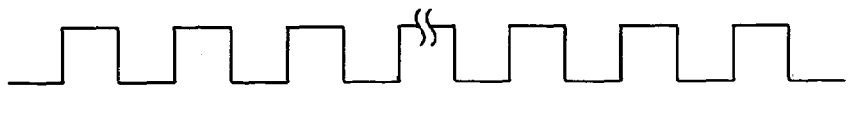
Fig.24C ΦV2
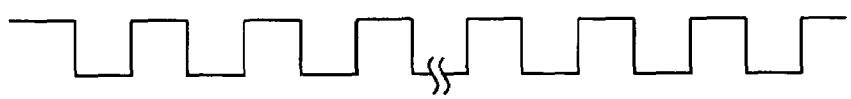
Fig.24D ΦVreset
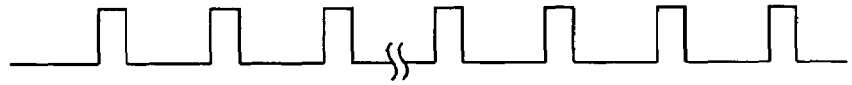
Fig.24E shift(V1)
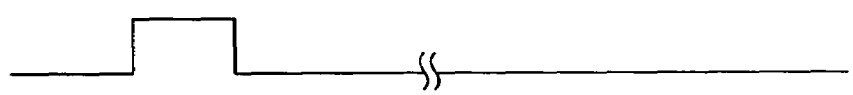
Fig.24F shift(V2)
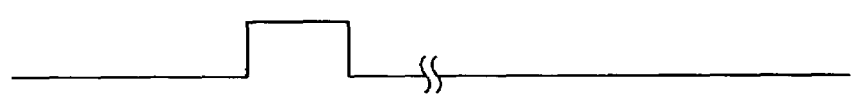
Fig.24G shift(V5)
Fig.24H shift(V6)
Fig.24I V1out
Fig.24J V2out

LIGHT DETECTION DEVICE, IMAGING DEVICE AND DISTANT IMAGE ACQUISITION DEVICE

TECHNICAL FIELD

The present invention relates to a photodetector which detects two-dimensional positions where light is incident, an imaging device using the photodetector, and a range image capture device using the imaging device.

BACKGROUND ART

Generally, in a known photo detector, image data obtained by imaging is taken into an image memory and then two-dimensional positions are detected after image processing, by the use of a solid-state image sensing device such as a MOS image sensor.

DISCLOSURE OF THE INVENTION

In the above-described known art, however, an image memory is required for storing the obtained image data, which causes a complicated structure of the device. Besides, since two-dimensional positions are detected by an operation process after storing the image data into the image memory, a detecting process of the two-dimensional positions takes time.

The present invention is accomplished in light of the foregoing circumstances, and the first object thereof is to provide a photodetector capable of achieving a faster detecting process of two-dimensional positions as well as a simpler structure.

The second object of the present invention is to provide an imaging device capable of achieving a faster detecting process of two-dimensional positions as well as a simpler structure, by using the above photodetector.

The third object of the present invention is to provide a range image capture device capable of achieving a lower current consumption and lower heat generation by maintaining a low operation speed for capturing a range image, using the above imaging device.

In order to attain the first object described above, a photodetector according to the present invention has a photosensitive region in which pixels are two-dimensionally arrayed, and this photodetector is characterized in that one pixel is configured by disposing a plurality of photosensitive portions to be adjacent to one another within one plane, each of the photosensitive portions outputting electric current corresponding to a incident light intensity. The photodetector is also characterized in that, across the plurality of pixels arrayed in a first direction in the two-dimensional array, photosensitive portions on one side, amongst the plurality of photosensitive portions configuring each of the pixels, are electrically connected to each other. The photodetector is further characterized in that, across the plurality of pixels arrayed in a second direction in the two-dimensional array, photosensitive portions on the other side, amongst the plurality of photosensitive portions configuring each of the pixels, are electrically connected to each other.

In the photodetector according to the present invention, light which is incident to one pixel is detected by each of the plurality of photosensitive portions that configure the pixel, and electric current corresponding to the light intensity sensed by each photosensitive portion is outputted. Since the photosensitive portions on one side are electrically connected to each other across the plurality of pixels arrayed in the first direction in the two dimensional array, electric currents from the photosensitive portions on one side are thereafter transmitted to the first direction. Meanwhile, the photosensitive portions on the other side are electrically connected to each other across the plurality of pixels arrayed in the second direction in the two-dimensional array. Therefore, electric currents from the photosensitive portions on the other side are transmitted to the second direction. In this way, the electric currents from the photosensitive portions on one side are transmitted in the first direction, and the electric currents from the photosensitive portions on the other side are transmitted in the second direction. Therefore, it makes it possible that both a luminous profile in the first direction and a luminous profile in the second direction are obtained independently. Consequently, it is possible to detect the two-dimensional positions of incident light quickly with an extremely simple structure in which the plurality of photosensitive portions is disposed in one pixel.

Further, each of the photosensitive portions includes a semiconductor substrate portion made of a first conductive type semiconductor, and second conductive type semiconductor regions formed in the semiconductor substrate portion. Each of the second conductive type semiconductor regions is in a shape of an approximate triangle when viewed from the light incident direction. Preferably, the approximate triangle is formed so that one side thereof is disposed adjacent to one side of another approximate triangle in one pixel. This type of configuration makes it possible to suppress an area reduction of each photo sensitive portion, when the plurality of photosensitive portions is arrayed within one pixel.

Each of the photosensitive portions includes the semiconductor substrate portion made of the first conductive type semiconductor, and the second conductive type semiconductor region formed in the semiconductor substrate portion. Each of the second conductive type semiconductor regions is in a shape of an approximate rectangle when viewed from the light incident direction. Preferably, the approximate rectangle is formed so that a long side thereof is disposed adjacent to a long side of another approximate rectangle in one pixel. This type of configuration makes it possible to suppress an area reduction of each photosensitive portion, when the plurality of photosensitive portions is disposed within one pixel.

Moreover, across the plurality of pixels arrayed in the first direction, wires for electrically connecting the photosensitive portions on one side are preferably provided between the pixels, extending in the first direction. It is also preferable that, across the plurality of pixels arrayed in the second direction, wires for electrically connecting the photosensitive portions on the other side are provided between pixels, extending in the second direction. With this type of configuration, each of the wires will not prevent light from being incident to the photosensitive portions, thus suppressing a detection sensitivity reduction.

Each of the photosensitive portions includes the semiconductor substrate portion made of the first conductive type semiconductor, and the second conductive type semiconductor regions formed in the semiconductor substrate portion. Each of the second conductive type semiconductor regions is divided into four parts within one pixel, and provided in the boundary between the divided parts are: wires for electrically connecting the photosensitive portions on one side across the plurality of pixels arrayed in the first direction; and wires for electrically connecting the photosensitive portions on the other side across the plurality of pixels arrayed in the second direction. In each of the second conductive type semiconductor regions, which are divided into four parts in one pixel, the divided parts in a diagonal relationship are connected to each wire.

Each of the photosensitive portions includes the semiconductor substrate portion made of the first conductive type semiconductor, and the second conductive type semiconductor regions formed in the semiconductor substrate portion. Each of the second conductive type semiconductor regions is in a shape of a polygon with four or more angles when viewed from the light incident direction. Preferably, the polygon is formed so that one side thereof is disposed adjacent to one side of another polygon in one pixel. This type of configuration makes it possible to suppress an area reduction of each photosensitive portion, when the plurality of photosensitive portions is disposed within one pixel. Additionally, a peripheral length of each photosensitive portion with respect to the area thereof is reduced, thereby lowering a value of dark current converted per unit area.

The second conductive type semiconductor regions of the photosensitive portion on one side, and the second conductive type semiconductor regions of the photosensitive portion on the other side are preferably placed in proximity in a row within one pixel in a third direction that intersects with the first and second directions. With this type of configuration, in a group of photosensitive portions on one side that are electrically connected across the plurality of pixels arrayed in the first direction, and another group of the photosensitive portions on the other side that are electrically connected across the plurality of pixels arrayed in the second direction, the photosensitive portions corresponding to each group of photosensitive portions are concentrated at the center of the corresponding group of photosensitive portions. Consequently, resolution is improved.

Furthermore, the second conductive type semiconductor regions are preferably arrayed in a honeycomb structure. With this type of structure, it is possible to further suppress an area reduction of each photosensitive portion, when the plurality of photosensitive portions is disposed within one pixel. In addition, since this structure is a high geometrical symmetry, ununiformity due to displacement of a mask used for forming the second conductive type semiconductor regions can be suppressed.

Moreover, it is preferable that the photodetector of the present invention further includes a first shift register, a second shift register, first integrating circuits, and second integrating circuits. The first shift register reads electric currents sequentially in the second direction. The electric currents are from the group of photosensitive portions on one side that are electrically connected amongst the plurality of pixels arrayed in the first direction. The second shift register reads electric currents sequentially in the first direction. The electric currents are from the group of photosensitive portions on the other side that are electrically connected amongst the plurality of pixels arrayed in the second direction. The first integrating circuits sequentially input the electric currents, which are from each group of photosensitive portions on one side and are sequentially read by the first shift register. The first integrating circuits then convert the electric currents into voltages and output the voltages. The second integrating circuits sequentially input the electric currents, which are from each group of photosensitive portions on the other side and are sequentially read by the second shift register. The second integrating circuits then convert the electric currents into voltages and output the voltages. With this configuration, the luminous profiles in the first direction and the second direction can be obtained with an extremely simple structure.

Furthermore, it is preferable that the photodetector of the present invention further includes the first integrating circuits, first CDS (Correlated Double Sampling) circuits, first sample-and-hold circuits, a first maximum value detecting circuit, and a first A/D conversion circuit. The first integrating circuits are provided corresponding to each relevant group of photosensitive portions on one side that are electrically connected amongst the plurality of pixels arrayed in the first direction. The first integrating circuits convert the electric currents from the corresponding group of photosensitive portions on one side into voltages, and output the voltages. The first CDS (Correlated Double Sampling) circuits are provided corresponding to each of the first integrating circuits, and output voltages defined according to variations of the voltages outputted from the corresponding first integrating circuits. The first sample-and-hold circuits are provided corresponding to each of the first CDS circuits, and hold and output the voltages from the corresponding first CDS circuits. The first maximum value detecting circuit detects a maximum value amongst the voltages that are respectively outputted from each of the first sample-and-hold circuits. The first A/D conversion circuit sequentially inputs the voltages from each of the first sample-and-hold circuits, then converts the voltage into digital values based on the maximum value detected by the first maximum value detecting circuit, and outputs the digital values. It is also preferable that the photodetector of the present invention further includes second integrating circuits, second CDS circuits, second sample-and-hold circuits, a second maximum value detecting circuit, and a second A/D conversion circuit. The second integrating circuits are provided corresponding to each relevant group of photosensitive portions on the other side that are electrically connected amongst the plurality of pixels arrayed in the second direction. The second integrating circuits convert the electric currents from the corresponding group of photosensitive portions on the other side into voltages, and thereafter output the voltages. The second CDS circuits are provided corresponding to each of the second integrating circuits, and output voltages defined according to variations of the voltages outputted from the corresponding second integrating circuits. The second sample-and-hold circuits are provided corresponding to each of the second CDS circuits, and hold and output the voltages from the corresponding second CDS circuits. The second maximum value detecting circuit detects a maximum value amongst the voltages that are respectively outputted from each of the second sample-and-hold circuits. The second A/D conversion circuit sequentially inputs the voltages from each of the second sample-and-hold circuits, converts the voltages into digital values based on the maximum value detected by the second maximum value detecting circuit, and then outputs the digital values. With this configuration, the first and second CDS circuits cancel noises due to errors even if the first and second integrating circuits respectively have different noise variations in each integration operation. Moreover, a resolving power of A/D conversion is superior not only when light incident to the photosensitive portions has a high intensity but also when the light has a low intensity. As a result, it is possible to obtain the luminous profiles in the first and second directions with a high accuracy.

Further, in order to attain the first object mentioned earlier, the photodetector according to the present invention having a photosensitive region, is characterized in that the photosensitive region includes a plurality of first photosensitive portions that are electrically connected to one another in the first direction, and a plurality of second photosensitive portions that are electrically connected to one another in the second direction. The plurality of first and second photosensitive portions is arrayed to be in a two-dimensionally mixed state within one plane.

In the photodetector according to the present invention, light that is incident to the photosensitive region is detected either by the first photosensitive portions or second photosensitive portions, and then electric currents corresponding to a light intensity is outputted from each photosensitive portion. Since the first photosensitive portions are electrically connected to each other in the first direction, the electric currents from the first photosensitive portions are transmitted in the first direction. Similarly, since the second photosensitive portions are electrically connected to each other, the electric currents from the second photosensitive portions are transmitted in the second direction. In this way, the electric currents from the first photosensitive portions are transmitted in the first direction, and the electric currents from the second photosensitive portions are transmitted in the second direction. Therefore, respective luminous profiles in the first and second directions can be obtained independently. As a result, fast detection of the two-dimensional positions of the incident light becomes possible with an extremely simple structure that the plurality of first and second photosensitive portions are arrayed to be in a two-dimensionally mixed state within one plane.

It is also preferable that the plurality of first photosensitive portions and the second photosensitive portions are alternately arrayed in the first or second direction. With such a configuration, it is possible to suppress an area reduction of each photosensitive portion, when the plurality of first and second photosensitive portions is arrayed to be in a two-dimensionally mixed state within the one plane.

Further, the plurality of first and second photosensitive portions is preferably arrayed alternately in the third direction that intersects the first and second directions. With this configuration, in the group of first photosensitive portions that are electrically connected to each other in the first direction, and the group of second photosensitive portions that are electrically connected to each other in the second direction, the photosensitive portions corresponding to each group of photosensitive portions are concentrated at the center of the corresponding group of photosensitive portions. Therefore, resolution can be improved.

In addition, each of the photosensitive portions is preferably arrayed in a honeycomb structure when viewed from the light incident direction. With this configuration, it is possible to further suppress an area reduction of each photo sensitive portion, when the plurality of first and second photosensitive portions is arrayed to be in a two-dimensionally mixed state within the one plane. Moreover, since this structure has a high geometrical symmetry, ununiformity due to displacement of a mask used for forming the second conductive type semiconductor region can be suppressed.

Further, it is preferable that each of the photosensitive portions includes the semiconductor substrate portion made of the first conductive type semiconductor, and the second conductive type semiconductor region formed in the semiconductor substrate portion. Each of the second conductive type semiconductor regions is in a shape of an approximate polygon when viewed from the light incident direction, and the approximate polygon is preferably formed so that one side thereof is disposed adjacent to one side of another approximate polygon. This type of configuration makes it possible to suppress an area reduction of each photo sensitive portion, when the plurality of first and second photosensitive portions is arrayed to be in a two-dimensionally mixed state within one plane. In the case of forming each of the second conductive type semiconductor regions to be a polygon with four or more angles, a peripheral length of each photosensitive portion with respect to the area thereof will be reduced, thereby lowering a value of dark current converted per unit area.

In addition, it is preferable that wires for electrically connecting the first photosensitive portions are provided, extending in the first direction between each of the photosensitive portions. It is also preferable that wires for electrically connecting the second photosensitive portions are provided, extending in the second direction between each of the photosensitive portions. With this type of configuration, each of the wires will not prevent light from being incident to the photosensitive portions, thus suppressing a detection sensitivity reduction.

Further, it is preferable that the photodetector of the present invention further includes a first shift register, a second shift register, a first integrating circuit, and a second integrating circuit. The first shift register reads electric currents sequentially in the second direction. The electric currents are from the group of first photosensitive portions that are electrically connected to each other in the first direction. The second shift register reads electric currents sequentially in the first direction. The electric currents are from the group of second photosensitive portions that are electrically connected to each other in the second direction. The first integrating circuit sequentially inputs the electric currents, which are from the group of first photosensitive portions and are sequentially read by the first shift register. Then, the first integrating circuit converts the electric currents into voltages. The second integrating circuit sequentially inputs the electric currents, which are from the group of second photosensitive portions and are sequentially read by the second shift register. Then, the second integrating circuit converts the electric currents into voltages. This configuration makes it possible to obtain the luminous profiles in the first and second directions with an extremely simple structure.

Furthermore, it is preferable that the photodetector of the present invention further includes the first integrating circuits, first CDS circuits, first sample-and-hold circuits, a first maximum value detecting circuit, and a first A/D conversion circuit. The first integrating circuits are provided corresponding to each relevant group of first photosensitive portions that are electrically connected to each other in the first direction. The first integrating circuits convert the electric currents from the corresponding group of first photosensitive portions into voltages, and output the voltages. The first CDS circuits are provided corresponding to each of the first integrating circuits, and output voltages defined according to variations of the voltages outputted from the corresponding first integrating circuits. The first sample-and-hold circuits are provided corresponding to each of the first CDS circuits, and hold and output the voltages from the corresponding first CDS circuits. The first maximum value detecting circuit detects a maximum value amongst the voltages that are respectively outputted from each of the first sample-and-hold circuits. The first A/D conversion circuit sequentially inputs the voltages from each of the first sample-and-hold circuits, then converts the voltages into digital values based on the maximum value detected by the first maximum value detecting circuit, and outputs the digital values. It is also preferable that the photodetector of the present invention further includes the second integrating circuits, second CDS circuits, second sample-and-hold circuits, a second maximum value detecting circuit, and a second A/D conversion circuit. The second integrating circuits are provided corresponding to each relevant group of second photosensitive portions that are electrically connected in the second direction. The second integrating circuits convert the electric currents from the corresponding group of second photosensitive portions into voltages, thereafter output the voltages. The second CDS circuits are provided corresponding to each of the second integrating circuits, and output voltages defined according to variations of the voltages -outputted from the corresponding second integrating circuits. The second sample-and-hold circuits are provided corresponding to each of the second CDS circuits, and hold and output the voltages from the corresponding second CDS circuits. The second maximum value detecting circuit detects a maximum value amongst the voltages respectively outputted from each of the second sample-and-hold circuits. The second A/D conversion circuit sequentially inputs the voltages from each of the second sample-and-hold circuits, converts the voltages into digital values based on the maximum value detected by the second maximum value detecting circuit, and then outputs the digital values. With this configuration, the first and second DCS circuits cancel noises due to errors even if the first and second integrating circuits respectively have different noise variations with respect to each integration operation. Moreover, a resolving power of A/D conversion is superior not only when light incident to the photosensitive portions has a high intensity but also when the light has a low intensity. As a result, it is possible to obtain the highly accurate luminous profiles in the first and second directions.

In order to attain the aforementioned second object, an imaging device of the present invention is characterized in that the foregoing photodetectors are two-dimensionally arranged.

Since the photodetectors are two-dimensionally arranged in the imaging device according to the present invention, a luminous profile of incident light can be detected at a high speed with an extremely simple structure.

Further, it is preferable that a first shift register and first integrating circuits are further included in each group of photodetectors configured of the plurality of photodetectors arranged in the second direction in a two-dimensional arrangement. The first shift register reads electric currents sequentially in the second direction. The electric currents are from each group of photosensitive portions on one side that are electrically connected across a plurality of pixels arrayed in a first direction. The first integrating circuits are respectively provided for each group of the photodetectors configured of the plurality of photodetectors arranged in the second direction. These first integrating circuits sequentially input the electric currents, which are from each group of photosensitive portions on one side and are sequentially read by the first shift register. Thereafter, the first integrating circuits convert the electric currents into voltages. It is also preferable that a second shift register and second integrating circuits are further included in each group of photodetectors configured of the plurality of photodetectors arranged in the first direction in the two-dimensional arrangement. The second shift register reads electric currents sequentially in the first direction. The electric currents are from each group of photosensitive portions on the other side that are electrically connected across the plurality of pixels arrayed in the second direction. The second integrating circuits are provided for each group of the photodetectors configured of the plurality of photodetectors arranged in the first direction. This second integrating circuits sequentially input the electric currents, which are from each group of photosensitive portions on the other side and are sequentially read by the second shift register. Thereafter, the second integrating circuits convert the electric currents into voltages.

In order to attain the aforementioned third object, a range image capture device according to the present invention is characterized in that the above-mentioned imaging devices are arranged as a pair, being spaced from each other at a predetermined interval. The range image capture device is also characterized by including parallax amount determining means, distance operation means, and range image generating means. The parallax amount determining means determines an amount of parallax for each photodetector, based on voltages from the first and second integrating circuits. The distance operation means operates a distance to an object in each photodetector based on the amount of parallax determined by the parallax amount determining means. The range image generating means forms a range image based on the distance operated by the distance operation means.

The range image capture device according to the present invention requires only an extremely small amount of data for capturing a range image in each of the photodetectors included in the imaging device. Consequently, it is possible to maintain a low operation speed for capturing the range image, thereby achieving a lower electric current consumption and lower heat generation.

BRIEF DESCRIPTION OF THE DRAWINGS

FIG. 23A is a graph showing changes over time of a start signal inputted to the first shift register.

FIG. 23B is a graph showing changes over time of a signal inputted to the first shift register.

FIG. 23C is a graph showing changes over time of a signal inputted to the first shift register.

FIG. 23D is a graph showing changes over time of a reset signal inputted to each of the first integrating circuits.

FIG. 23E is a graph showing changes over time of a signal outputted from the first shift register.

FIG. 23F is a graph showing changes over time of a signal outputted from the first shift register.

FIG. 23G is a graph showing changes over time of a signal outputted from the first shift register.

FIG. 23H is a graph showing changes over time of a signal outputted from the first shift register.

FIG. 23I is a graph showing changes over time of voltage outputted from each of the first integrating circuits.

FIG. 23J is a graph showing changes over time of voltage outputted from each of the first integrating circuits.

FIG. 24A is a graph showing changes over time of a start signal inputted to the second shift register.

FIG. 24B is a graph showing changes over time of a signal inputted to the second shift register.

FIG. 24C is a graph showing changes over time of a signal inputted to the second shift register.

FIG. 24D is a graph showing changes over time of a reset signal inputted to each of the second integrating circuits.

FIG. 24E is a graph showing changes over time of a signal outputted from the second shift register.

FIG. 24F is a graph showing changes over time of a signal outputted from the second shift register.

FIG. 24G is a graph showing changes over time of a signal outputted from the second shift register.

FIG. 24H is a graph showing changes over time of a signal outputted from the second shift register.

FIG. 24I is a graph showing changes over time of voltages outputted from each of the second integrating circuits.

FIG. 24J is a graph showing changes over time of voltage outputted from each of the second integrating circuits.

BEST MODES FOR CARRYING OUT THE INVENTION

A photodetector according to the present invention will be described with reference to the drawings. In the descriptions that follow, the same constituents or such constituents that have the same functions will be denoted with the same reference numbers, and thus duplicated description is omitted. Hereinafter, parameters M and N are respectively taken as integers of two or greater. In addition, unless other wise particularly stated, a parameter m is taken as any integer of one or greater but not exceeding M and a parameter n is taken as any integer of one or grater but not exceeding N.

Figure 1:
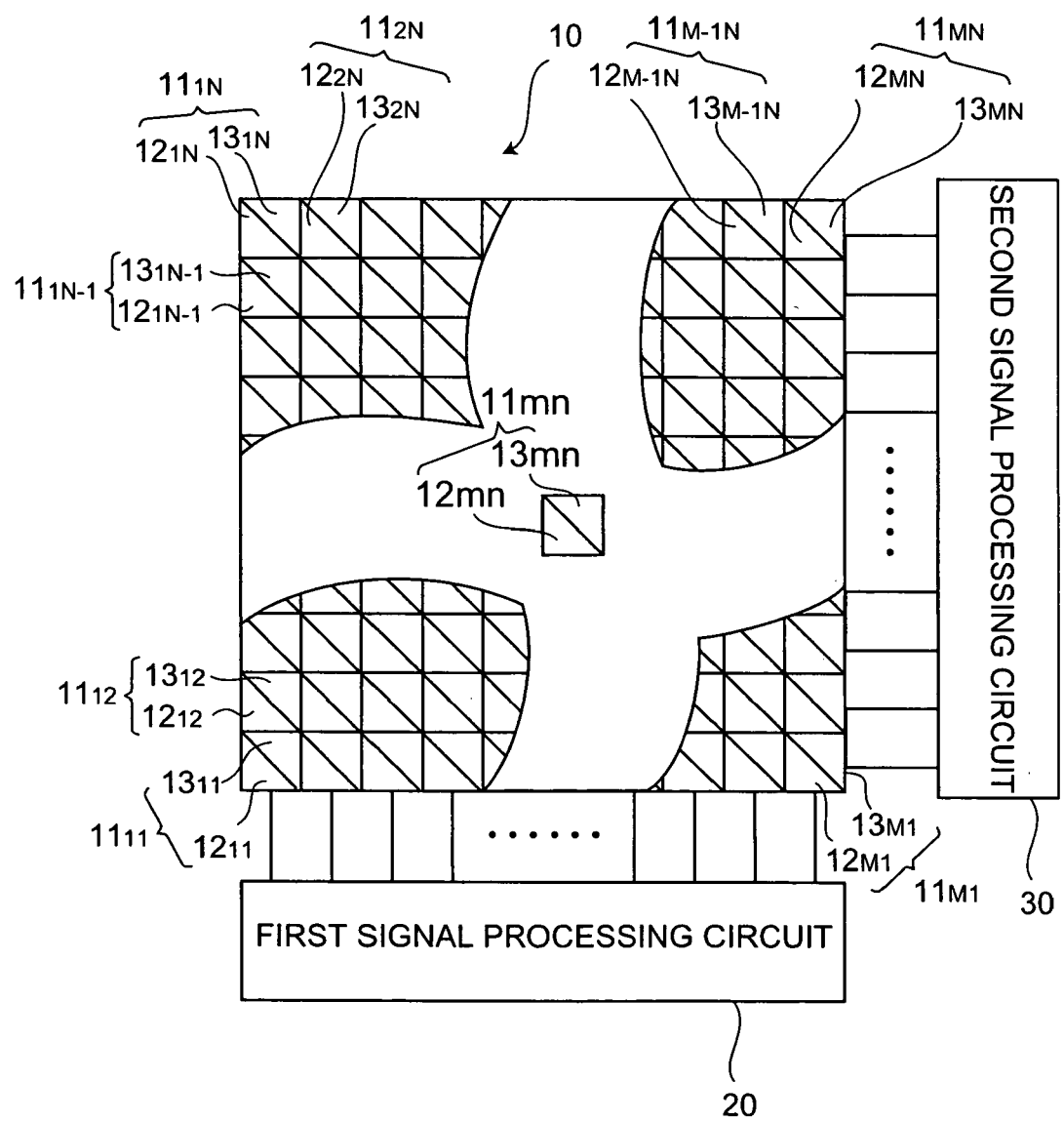
FIG. 1 is a conceptual schematic diagram showing a configuration of a photodetector according to the present embodiment.

FIG. 1 is a conceptual diagram showing a configuration of the photodetector according to this embodiment. As shown in FIG. 1, the photodetector 1 of this embodiment includes a photosensitive region 10, a first signal processing circuit 20, and a second signal processing circuit 30.

In the photosensitive region 10, pixels $11_{mn}$ are two-dimensionally arrayed in M rows and N columns. One of the pixels is configured by disposing a photosensitive portion $12_{mn}$ (first photosensitive portion) and a photosensitive portion $13_{mn}$ (second photosensitive portion) adjacent to each other within the same plane. The photosensitive portion $12_{mn}$ and $13_{mn}$ respectively output electric currents in accordance with intensities of light that is incident to each of the photosensitive portions. Accordingly, in the photosensitive region 10, the photosensitive portion $12_{mn}$ and $13_{mn}$ are arrayed to be two-dimensionally mixed within the same plane.

Across the plurality of pixels $11_{11}$ to $11_{1N}$, $11_{21}$ to $11_{2N}$, . . . , and $11_{M1}$ to $11_{MN}$ that are arrayed in a first direction in the two-dimensional array, the photosensitive portions $12_{mn}$ on one side (for example, photosensitive portions on one side $12_{11}$ to $12_{1N}$) among the plurality of photosensitive portions $12_{mn}$ and $13_{mn}$ are electrically connected to each other. In addition, across the plurality of pixels $11_{11}$ to $11_{M1}$, $11_{12}$ to $11_{M2}$, . . . , and $11_{1N}$ to $11_{MN}$ that are arrayed in a second direction in the two-dimensional array, the photosensitive portions $13_{mn}$ on the other side (e.g., photosensitive portions on the other side $13_{11}$ to $13_{M1}$) among the plurality of photosensitive portions $12_{mn}$ and $13_{mn}$ are electrically connected to each other.

Figure 2:
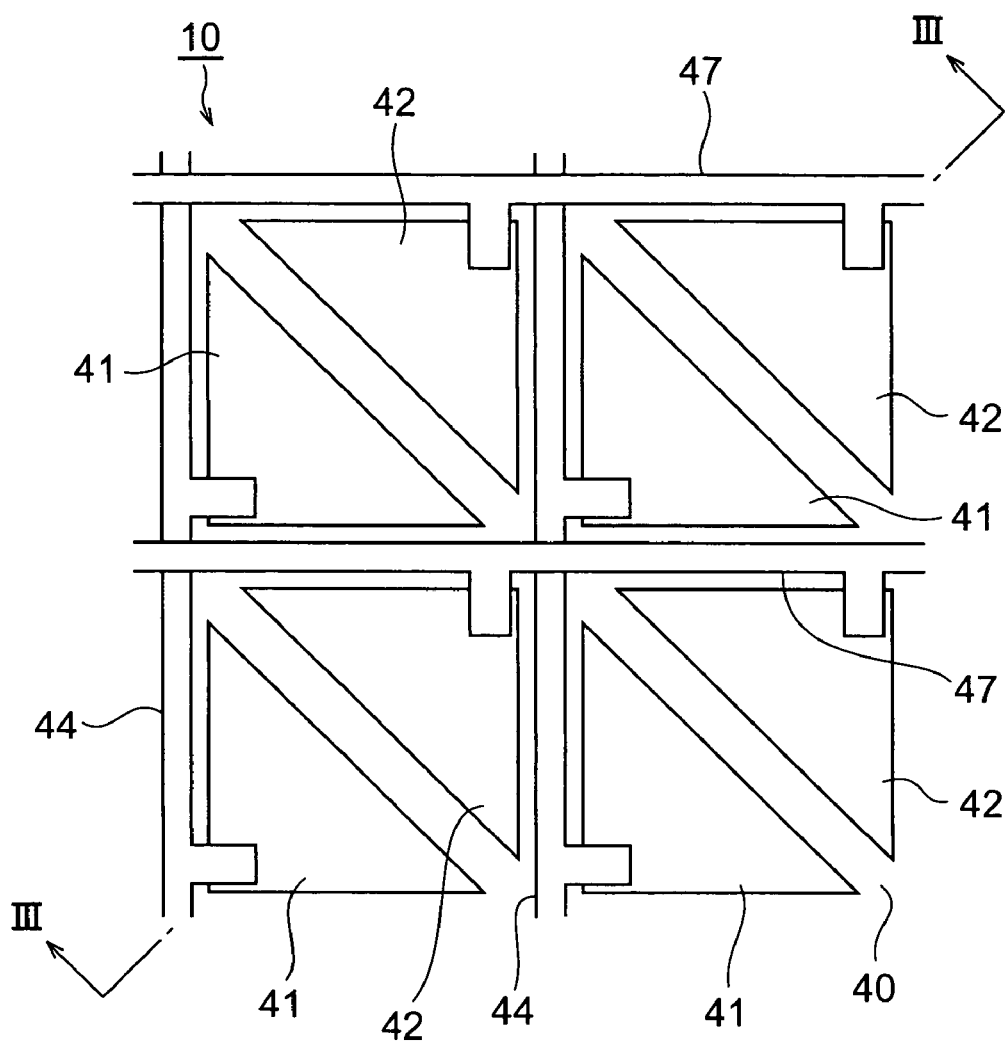
FIG. 2 is a plan view showing an example of a photosensitive region included in the photodetector according to the present embodiment.
Figure 3:
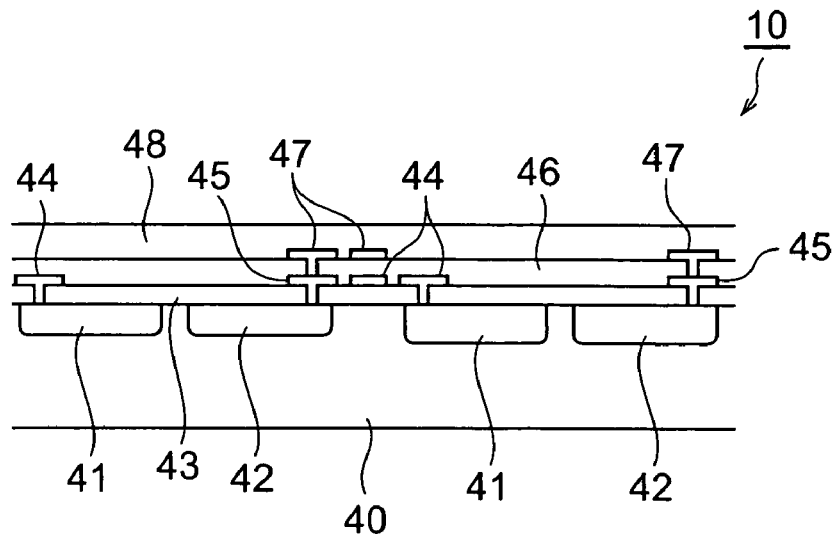
FIG. 3 is a cross-sectional view taken along the line III—III of FIG. 2.

Here, the configuration of the photosensitive region 10 will be described based on FIGS. 2 and 3. FIG. 2 is a plan view showing an example of the photosensitive region included in the photodetector. FIG. 3 is a cross-sectional view taken along the line III—III of FIG. 2. In FIG. 2, depiction of a protective layer 48 is omitted.

The photosensitive region 10 includes a semiconductor substrate 40 made of P-type (first conductive type) semiconductor, and N-type (second conductive type) semiconductor regions 41 and 42 formed on the surface of the semiconductor substrate 40. In this way, each of the photosensitive portions $12_{mn}$ and $13_{mn}$ includes the semiconductor substrate 40 and a pair of second conductive type semiconductor regions 41 and 42, thereby constituting a photodiode. As shown in FIG. 2, each of the second conductive type semiconductor regions 41 and 42 is in a shape of an approximate triangle when viewed from a light incident direction. These two regions 41 and 42 are formed so that one side of each region comes adjacent to each other in one pixel. The semiconductor substrate 40 serves as a ground potential. The photosensitive region 10 may also be configured by including a semiconductor substrate made of N-type semiconductor, and P-type semiconductor regions formed on a surface of the semiconductor substrate. As seen in FIG. 2, the region 41 (photosensitive portion $12_{mn}$) and the region 42 (photosensitive portion $13_{mn}$) are alternately arrayed in the first and second directions. In addition, the region 41 (photosensitive portion $12_{mn}$) and the region 42 (photosensitive portion $13_{mn}$) are alternately arrayed in third and fourth directions that intersect the first and second directions (for example, at an angle of 45 degrees)

A first insulating layer 43 is formed on the semiconductor substrate 40 and the regions 41 and 42. A first wire 44 is electrically connected to the region 41 on one side through a contact hole formed in the first insulating layer 43. Further, an electrode 45 is electrically connected to the region 42 on the other side through the contact hole formed in the first insulating layer 43.

A second insulating layer 46 is formed on the first insulating layer 43. A second wire 47 is electrically connected to the electrode 45 through a contact hole formed in the second insulating layer 46. The region 42 on the other side is thereby electrically connected to the second wire 47 through the electrode 45.

A protective layer 48 is formed on the second insulating layer 46. The first and second insulating layers 43 and 46, and the protective layer 48 are made of $SiO_2$, SiN or the like. The first wire 44, electrode 45, and second wire 47 are made of metal such as Al.

The first wire 44 is for electrically connecting the regions 41 on one side in each of the pixels $11_{mn}$ in the first direction, and is provided extending in the first direction among the pixels $11_{mn}$. Since the regions 41 on one side in each of the pixels $11_{mn}$ are electrically connected by the first wire 44 in this way, the photosensitive portions $12_{mn}$ on one side (for example, photosensitive portions on one side $12_{11}$ to $12_{1N}$) are electrically connected to each other, across the plurality of pixels $11_{11}$ to $11_{1N}$, $11_{21}$ to $11_{2N}$, . . . , and $11_{M1}$ to $11_{MN}$ that are arrayed in the first direction in the two-dimensional array. Accordingly, a long photosensitive portion extending in the first direction is configured in the photosensitive region 10. The long photosensitive portions extending in the first direction are formed in M columns.

The second wire 47 is for electrically connecting the regions 42 on the other side in each of the pixel $11_{mn}$ in the second direction, and is provided extending in the second direction among the pixels $11_{mn}$. Since the regions 42 on the other side in each of the pixels $11_{mn}$ are electrically connected by the second wire 47 in this way, the photosensitive portions $13_{mn}$ on the other side (for example, photosensitive portions on one side $13_{11}$ to $13_{M1}$) are electrically connected to each other, across the plurality of pixels $11_{11}$ to $11_{M1}$, $11_{12}$ to $11_{M2}$, . . . , and $11_{1N}$ to $11_{MN}$ that are arrayed in the second direction in the two-dimensional array. Accordingly, along photosensitive portion extending in the second direction is configured in the photosensitive region 10. The long photosensitive portions extending in the second direction is formed in N rows.

Furthermore, M columns of the long photosensitive portions extending in the first direction and N rows of the long photosensitive portions extending in the second direction described above are formed on the same plane.

Shapes of the regions 41 and 42 are not limited to an approximate triangle as illustrated in FIG. 2, and other shapes may be applicable as illustrated in FIGS. 4 to 8.

Figure 4:
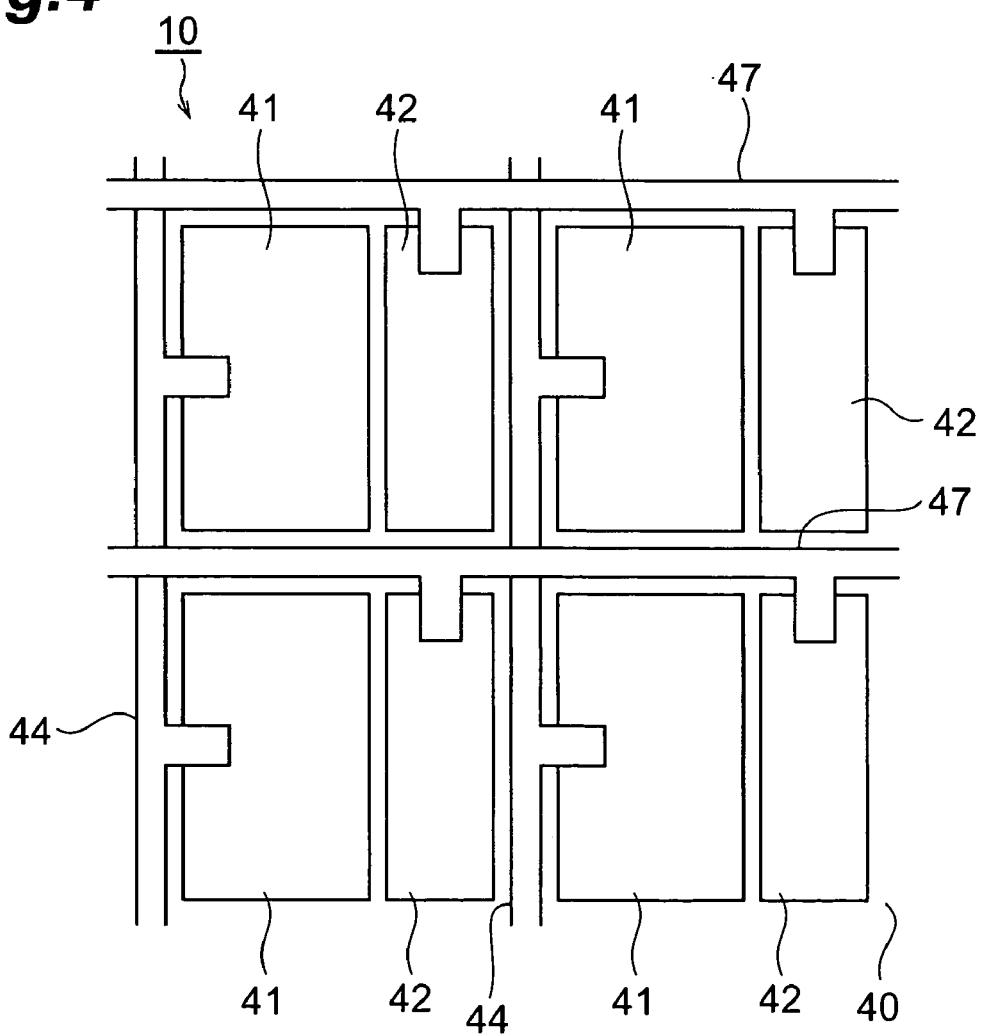
FIG. 4 is a plan view showing an example of the photosensitive region included in the photodetector according to the present embodiment.

The second conductive type semiconductor region (photosensitive portion) depicted in FIG. 4 is in a shape of a rectangle when viewed from the light incident direction. Two of these regions 41 and 42 are formed so that a long side of each region is adjacent to each other in one pixel. The region 41 (photosensitive portion $12_{mn}$) and the region 42 (photosensitive portion $13_{mn}$) are arrayed alternately in the second direction. As shown in FIG. 4, although the second conductive type semiconductor regions in the first direction and the second conductive type semiconductor regions in the second direction can have a different area from each other within one pixel, each of the regions arrayed in the same direction uniformly has a specific area among the pixels. Specifically, the total areas of photosensitive portions connected by all the wires extending in the same direction may be the same compared to each other.

Figure 5:
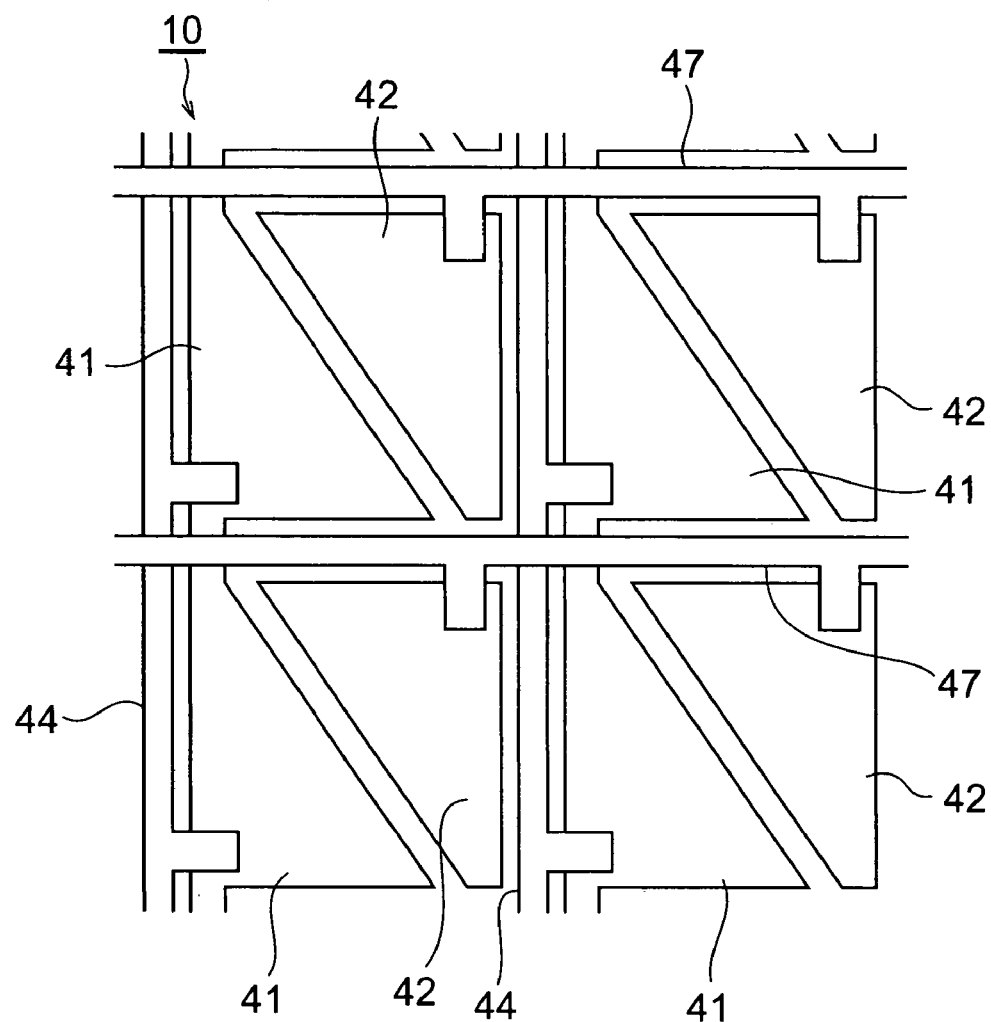
FIG. 5 is a plan view showing an example of the photosensitive region included in the photodetector according to the present embodiment.

In the second conductive type semiconductor region (photosensitive portion) shown in FIG. 5, the regions 41 on one side, each being in a shape of an approximate triangle, are formed continuously in the first direction. The regions 42 on the other side, each being in a shape of an approximate triangle, are discretely formed in respective pixels $11_{mn}$. The region 41 (photosensitive portion $12_{mn}$) and the region 42 (photosensitive portion $13_{mn}$) are arrayed alternately in the second direction. In the case of continuously forming the region 41 on one side in the first direction, the first wire 44 is not always required. However, concerning a possible reduction in sensing speed due to an increase in series resistance, it is preferable that the regions 41 are electrically connected by the first wire 44.

Figure 6:
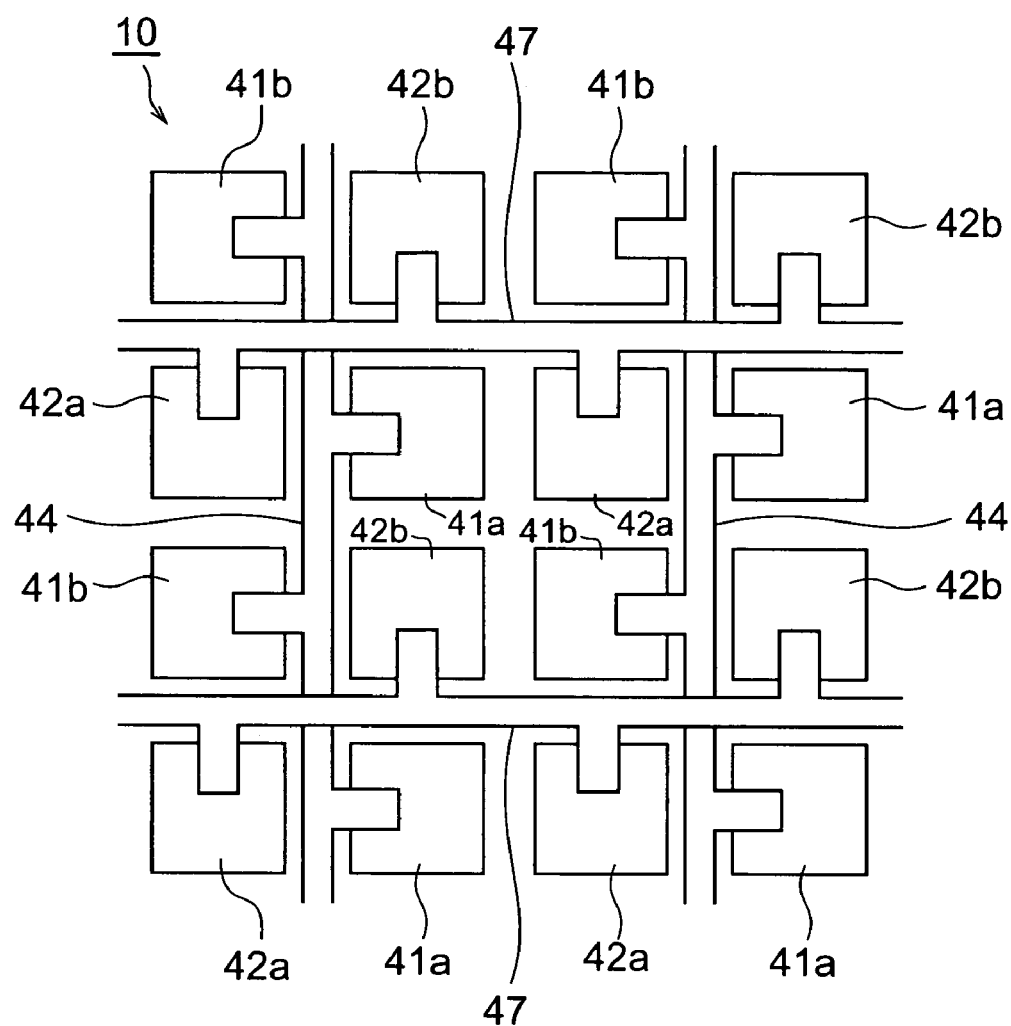
FIG. 6 is a plan view showing an example of the photosensitive region included in the photodetector according to the present embodiment.

The second conductive type semiconductor region (photosensitive region) shown in FIG. 6 includes four parts $41a$, $41b$, $42a$, and $42b$ per one pixel. The pair of regions diagonally opposite to each other is electrically connected by either the first wire 44 or second wire 47. The region 41 (photosensitive portion 12$_{mn}$) and the region 42 (photosensitive portion 13$_{mn}$) are alternately arrayed in the first and second directions. Additionally, the region 41 (photosensitive portion 12$_{mn}$) and the region 42 (photosensitive portion 13$_{mn}$) are arrayed alternately in the third and fourth directions.

Figure 7:
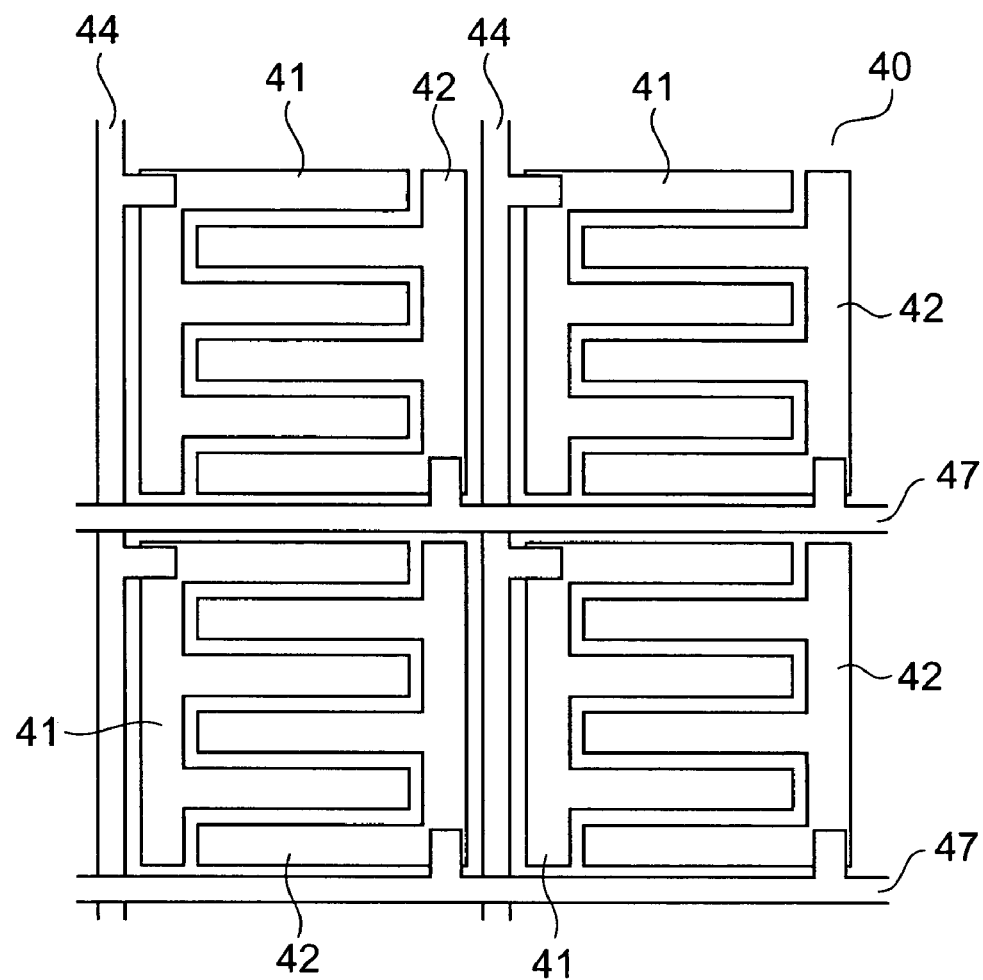
FIG. 7 is a plan view showing an example of the photosensitive region included in the photodetector according to the present embodiment.

In the second conductive type semiconductor region (photosensitive region) shown in FIG. 7, two pectinate regions 41 and 42 are formed to be engaged with each other.

Figure 8:
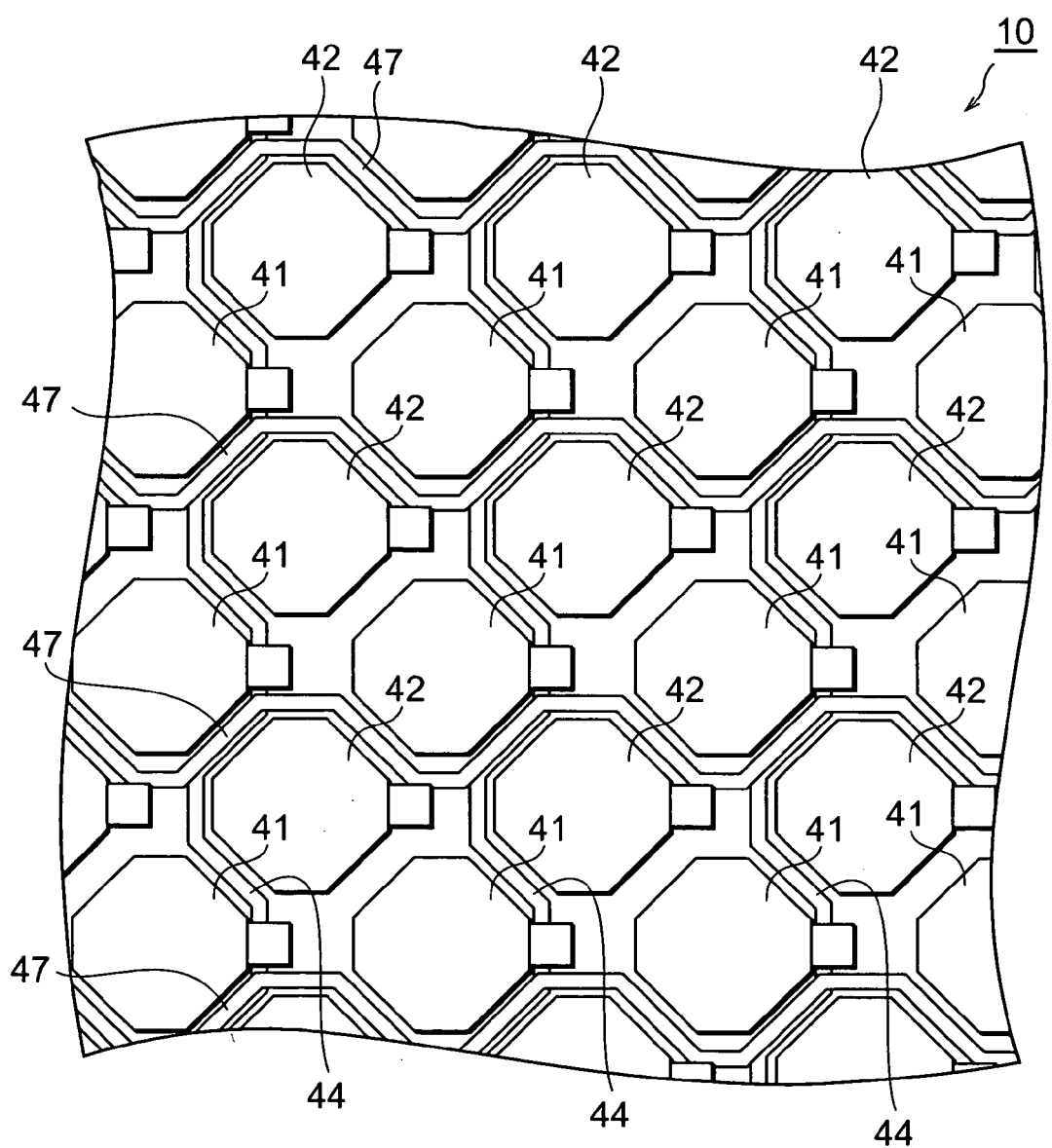
FIG. 8 is a plan view showing an example of the photosensitive region included in the photodetector according to the present embodiment.

The second conductive type semi conductor region (photosensitive region) shown in FIG. 8 is in a shape of a polygon with four or more angles (for example, octagon), which is formed so that one line of the polygon comes adjacent to one line of the other polygon in one pixel. In one pixel, the regions 41 and 42 are placed in proximity in a row in the third direction that intersects the first and second directions. These regions are arrayed in a honeycomb structure when viewed from a light incident direction. Specifically, the region 41 (photosensitive portion 12$_{mn}$) and the region 42 (photosensitive portion 13$_{mn}$) are arrayed alternately in the third and fourth directions.

Figure 9:
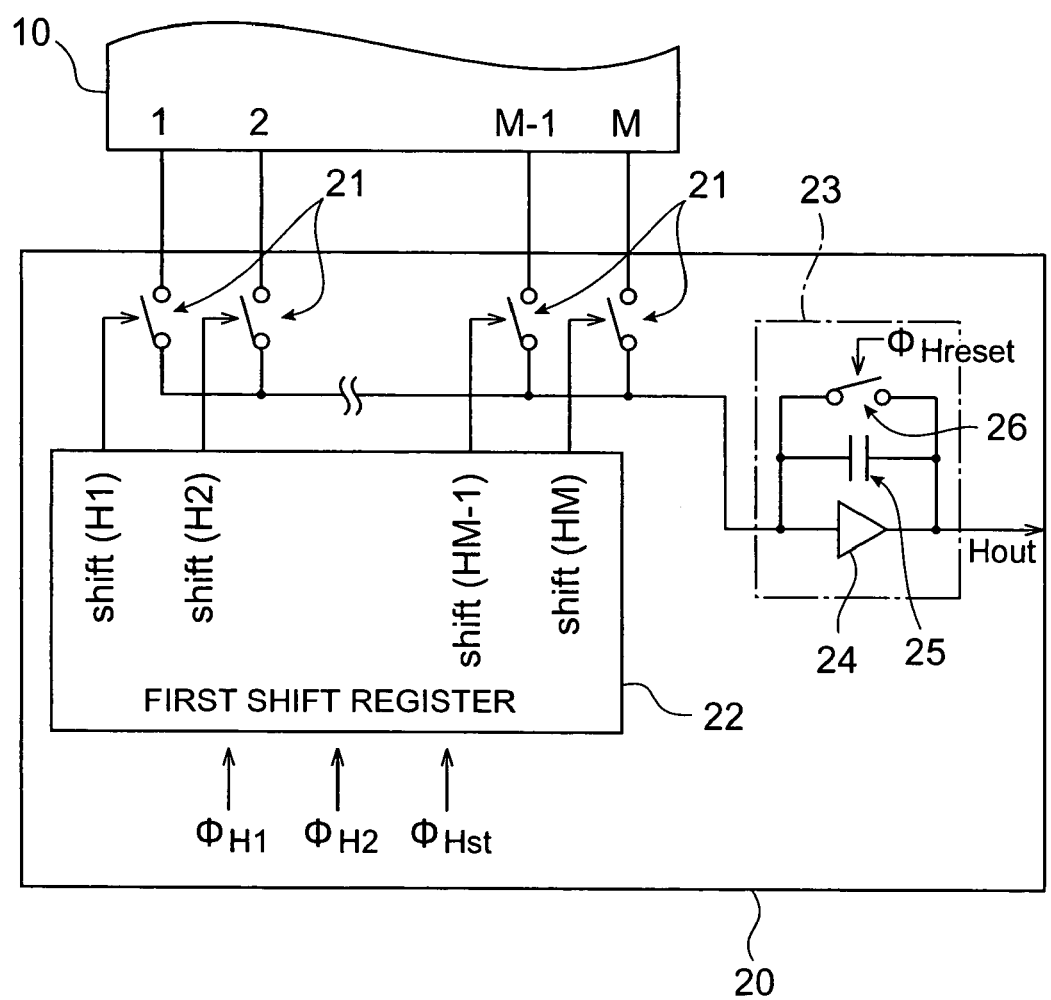
FIG. 9 is a schematic block diagram showing a first signal processing circuit included in the photodetector according to the present embodiment.
Figure 10:
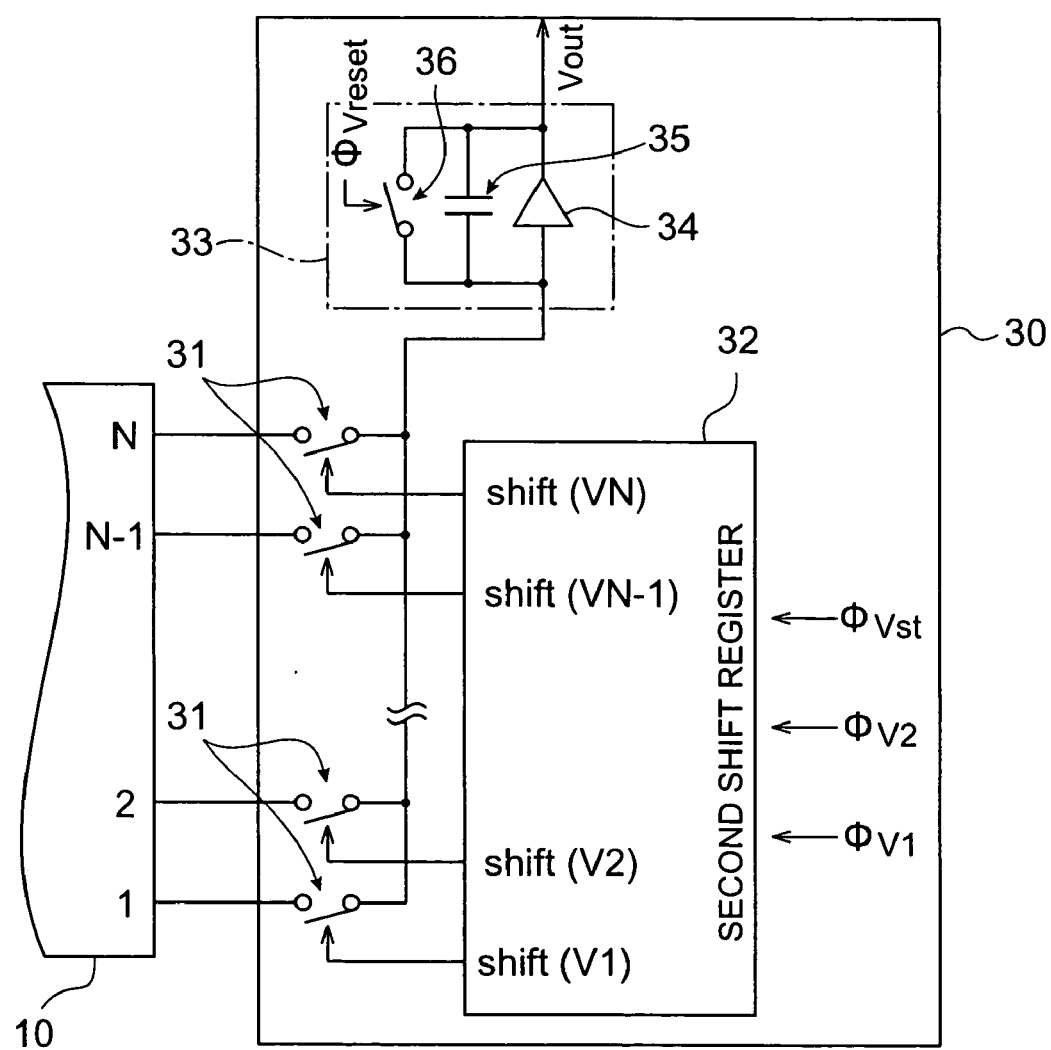
FIG. 10 is a schematic block diagram showing a second signal processing circuit included in the photodetector according to the present embodiment.

Hereinafter, configurations of a first signal processing circuit 20 and a second signal processing circuit 30 will be described based on FIGS. 9 and 10. FIG. 9 is a schematic block diagram showing the first signal processing circuit, and FIG. 10 is a schematic block diagram showing the second signal processing circuit.

The first signal processing circuit 20 outputs a voltage $H_{out}$ that indicates a luminous profile in the second direction of incident light to the photosensitive region 10. The second signal processing circuit 30 outputs a voltage $V_{out}$ that indicates a luminous profile in the first direction of incident light to the photosensitive region 10. The first and second signal processing circuits 20 and 30 may be operated simultaneously or individually in a time-series order.

As shown in FIG. 9, the first signal processing circuit 20 includes first switches 21, a first shift register 22, and first integrating circuit 23. The first switches 21 are provided corresponding to each relevant group of photosensitive portions 12$_{mn}$ on one side (M columns of long photosensitive portions configured of the second conductive type semiconductor regions 41 on one side, extending in the first direction). These photosensitive portions 12$_{mn}$ are electrically connected across the plurality of pixels 11$_{11}$ to 11$_{1N}$, 11$_{21}$ to 11$_{2N}$, . . . , and 11$_{M1}$ to 11$_{MN}$ arrayed in the first direction. The first shift register 22 sequentially reads electric currents in the second direction. The electric currents are from the group of photosensitive portions 12$_{mn}$ on one side that are electrically connected across the plurality of pixels 11$_{11}$ to 11$_{1N}$, 11$_{21}$ to 11$_{2N}$, . . . , and 11$_{M1}$ to 11$_{MN}$ arrayed in the first direction. The first integrating circuits 23 sequentially receive the electric currents, which are from each group of photosensitive portions 12$_{mn}$ on one side and are sequentially connected by the first shift register 22. Then, the first integrating circuit 23 converts the electric current into voltage and outputs the voltage.

The first switches 21 are controlled by a signals shift ($H_m$) outputted from the first shift register 22, and then are sequentially closed. Electric charges are accumulated in the group of photosensitive portions 12$_{mn}$ on one side that are electrically connected across the plurality of pixels 11$_{11}$ to 11$_{1N}$, 11$_{21}$ to 11$_{2N}$, . . . , and 11$_{M1}$ to 11$_{MN}$ arrayed in the first direction. By closing the first switches 21, the above accumulated electric charges are changed into electric currents, which are then outputted to the first integrating circuit 23 through the first wires 44 and the first switches 21. Operations of the first shift register 22 are controlled by signals $\Phi_{H1}$, $\Phi_{H2}$ and $\Phi_{Hst}$ outputted from a control circuit (not shown), thus closing the first switches 21 sequentially.

The first integrating circuit 23 is inputted the electric currents from the groups of photosensitive portions 12$_{mn}$ on one side that are electrically connected across the plurality of pixels 11$_{11}$ to 11$_{1N}$, 11$_{21}$ to 11$_{2N}$, . . . , and 11$_{M1}$ to 11$_{MN}$ arrayed in the first direction. The first integrating circuit 23 includes an amplifier 24, a capacitor 25, and a switch 26. The amplifier 24 amplifies electric charges of the electric currents that inputs to the first integrating circuit 23. In the capacitor 25, one terminal thereof is connected to an input terminal of the amplifier 24, and the other terminal thereof is connected to an output terminal of the amplifier 24. In the switch 26, one terminal thereof is connected to the input terminal of the amplifier 24, and the other terminal thereof is connected to the output terminal of the amplifier 24. The switch 26 is turned to an "ON" state when a reset signal $\Phi_{Hreset}$ outputted from the control circuit is significant, and is turned to an "OFF" state when the reset signal $\Phi_{Hreset}$ is insignificant.

When the switch 26 is in the "ON" state, the first integrating circuit 23 discharges electricity to reset the capacitor 25. On the other hand, when the switch 26 is in the "OFF" state, the first integrating circuit 23 accumulates the electric charges in the capacitor 25. These electric charges have been inputted to the input terminal from the groups of photosensitive portions 12$_{mn}$ on one side that are electrically connected across the plurality of pixels 11$_{11}$ to 11$_{1N}$, 11$_{21}$ to 11$_{2N}$, . . . , and 11$_{M1}$ to 11$_{MN}$ arrayed in the first direction. Thereafter, the first integrating circuit 23 outputs voltages $H_{out}$ corresponding to the above-mentioned accumulated electric charges.

As shown in FIG. 10, the second signal processing circuit 30 includes second switches 31, a second shift register 32, and a second integrating circuit 33. The second switches 31 are provided corresponding to each relevant group of photosensitive portions 13$_{mn}$ on the other side (N rows of long photosensitive portions configured of the second conductive type semiconductor regions 42 on the other side, extending in the second direction). These photosensitive portions 13$_{mn}$ are electrically connected across the plurality of pixels 11$_{11}$ to 11$_{M1}$, 11$_{12}$ to 11$_{M2}$, . . . , and 11$_{1N}$ to 11$_{MN}$ arrayed in the second direction. The second shift register 32 sequentially reads electric currents in the first direction. The electric currents are from the groups of photosensitive portions 13$_{mn}$ on the other side that are electrically connected across the plurality of pixels 11$_{11}$ to 11$_{M1}$, 11$_{12}$ to 11$_{M2}$, . . . , and 11$_{1N}$ to 11$_{MN}$ arrayed in the second direction. The second integrating circuit 33 is sequentially inputted of the electric currents, which are from each group of photosensitive portions 13$_{mn}$ on the other side and are sequentially connected by the second shift register 32. Then, the second integrating circuit 33 converts the electric currents into voltages and outputs the voltages.

The second switches 31 are controlled by a signals shift ($V_n$) outputted from the second shift register 32, and then are sequentially closed. Electric charges are accumulated in the groups of photosensitive portions 13$_{mn}$ on the other side that are electrically connected across the plurality of pixels 11$_{11}$ to 11$_{M1}$, 11$_{12}$ to 11$_{M2}$, . . . , and 11$_{1N}$ to 11$_{MN}$ arrayed in the second direction. By closing the second switches 31, the above accumulated electric charges are changed into electric currents, which are then inputted to the second integrating circuit 33 through the second wires 47 and the second switches 31. Operations of the second shift register 32 are controlled by signals $\Phi_{V1}$, $\Phi_{V2}$ and $\Phi_{Vst}$ outputted from a control circuit (not shown), thus closing the second switches 31 sequentially.

The second integrating circuit 33 is inputted the electric currents from the groups of photosensitive portions $13_{mn}$ on the other side that are electrically connected across the plurality of pixels $11_{11}$ to $11_{M1}$, $11_{12}$ to $11_{M2}$, . . . , and $11_{1N}$ to $11_{MN}$ arrayed in the second direction. The second integrating circuit 33 includes an amplifier 34, a capacitor 35, and a switch 36. The amplifier 34 amplifies electric charges of the electric currents that are inputted to the second integrating circuits 33. In the capacitor 35, one terminal thereof is connected to an input terminal of the amplifier 34, and the other terminal thereof is connected to an output terminal of the amplifier 34. In the switch 36, one terminal thereof is connected to the input terminal of the amplifier 34, and the other terminal thereof is connected to the output terminal of the amplifier 34. The switch 36 is turned to an "ON" state when a reset signal $\Phi_{Vreset}$ outputted from the control circuit is significant, and is turned to an "OFF" state when the reset signal $\Phi_{Vreset}$ is insignificant.

When the switch 36 is in the "ON" state, the second integrating circuit 33 discharges electricity to reset the capacitor 35. On the other hand, when the switch 36 is in the "OFF" state, the second integrating circuit 33 accumulates the electric charges in the capacitor 35. These electric charges have been inputted to the input terminal from the groups of photosensitive portions $13_{mn}$ on the other side that are electrically connected across the plurality of pixels $11_{11}$ to $11_{M1}$, $11_{12}$ to $11_{M2}$, . . . , and $11_{1N}$ to $11_{MN}$ arrayed in the second direction. Thereafter, the second integrating circuit 33 outputs voltages $V_{out}$ corresponding to the above-mentioned accumulated electric charges.

Hereinafter, operations of the first signal processing circuit 20 and the second signal processing circuit 30 will be described based on FIGS. 11A to 11I and FIGS. 12A to 12I. FIGS. 11A to 11I are timing charts for explaining the operations of the first signal processing circuit. FIGS. 12A to 12I are timing charts for explaining the operations of the second signal processing circuit.

After the start signal $\Phi_{Hst}$ is inputted to the first shift register 22 from the control circuit (see FIG. 11A), signals shifts ($H_M$), each having a pulse width corresponding to a duration from a rise of the signal $\Phi_{H2}$ to a fall of the signal $\Phi_{H1}$, are sequentially outputted (see FIGS. 11B and 11C, and FIGS. 11E to 11H). When the first shift register 22 outputs the shift ($H_M$) to each of the corresponding first switches 21, the first switches 21 are sequentially closed. Thereafter, the electric charges accumulated in the corresponding group of photosensitive portions $12_{mn}$ on one side are turned into electric currents and are sequentially inputted to the first integrating circuits 23.

Figure 11A:
FIG. 11A is a graph showing changes over time of a start signal inputted to a first shift register.
Figure 11B:
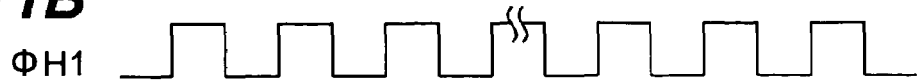
FIG. 11B is a graph showing changes over time of a signal inputted to the first shift register.
Figure 11C:
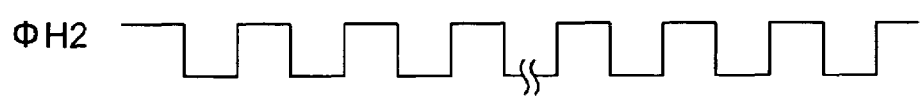
FIG. 11C is a graph showing changes over time of a signal inputted to the first shift register.
Figure 11D:
FIG. 11D is a graph showing changes over time of a reset signal inputted to each of first integrating circuits.
Figure 11E:
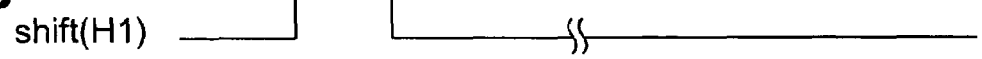
FIG. 11E is a graph showing changes over time of a signal outputted from the first shift register.
Figure 11F:
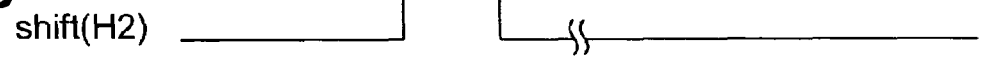
FIG. 11F is a graph showing changes over time of a signal outputted from the first shift register.
Figure 11G:
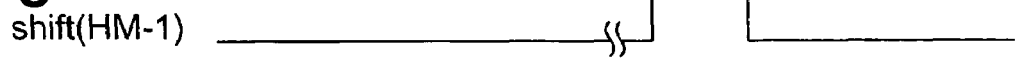
FIG. 11G is a graph showing changes over time of a signal outputted from the first shift register.
Figure 11H:
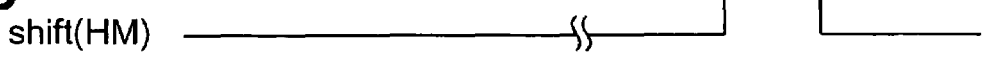
FIG. 11H is a graph showing changes over time of a signal outputted from the first shift register.
Figure 11I:
FIG. 11I is a graph showing changes over time of a voltage outputted from the first signal processing circuit.

The reset signal $\Phi_{Hreset}$ is inputted to the first integrating circuit 23 from the control circuit (see FIG. 11D). While the reset signal $\Phi_{Hreset}$ is in an "OFF" state, the electric charges accumulated in the corresponding group of photosensitive portions $12_{mn}$ on one side are accumulated in the capacitor 25. Then, voltages $H_{out}$ corresponding to amounts of the accumulated electric charges are sequentially outputted from the first integrating circuit 23 (see FIG. 11I). When the reset signal $\Phi_{Hreset}$ is in an "ON" state, the first integrating circuit 23 closes the switch 26 and reset the capacitor 25.

In this way, the first signal processing circuit 20 sequentially outputs the voltages $H_{out}$ as time-series data of each of the corresponding groups of photosensitive portions $12_{mn}$ on one side. The voltages $H_{out}$ correspond to the electric charges (electric currents) accumulated in the groups of photosensitive portions $12_{mn}$ on one side that are electrically connected across the plurality of pixels $11_{11}$ to $11_{1N}$, $11_{21}$ to $11_{2N}$, . . . , and $11_{M1}$ to $11_{MN}$ arrayed in the first direction. The time-series data indicates a luminous profile in the second direction.

After the start signal $\Phi_{Vst}$ is inputted to the second shift register 32 from the control circuit (see FIG. 12A), signals shifts ($V_n$), each having a pulse width corresponding to a duration from a rise of the signal $\Phi_{V2}$ to a fall of the signal $\Phi_{V1}$ are sequentially outputted (see FIGS. 12B and 12C, and FIGS. 12E to 12H). When the second shift register 32 outputs the shift ($V_n$) to each of the corresponding second switches 31, the second switches 31 are sequentially closed. Thereafter, the electric charges accumulated in the corresponding group of photosensitive portions $13_{mn}$ on the other side are turned into electric currents and sequentially inputted to the second integrating circuit 33.

Figure 12A:
FIG. 12A is a graph showing changes over time of a start signal inputted to a second shift register.
Figure 12B:
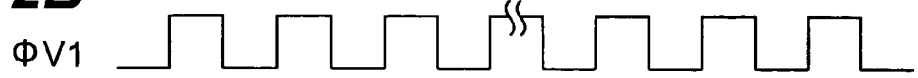
FIG. 12B is a graph showing changes over time of a signal inputted to the second shift register.
Figure 12C:
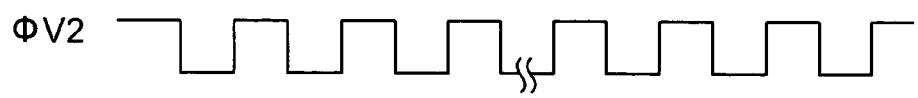
FIG. 12C is a graph showing changes over time of a signal inputted to the second shift register.
Figure 12D:
FIG. 12D is a graph showing changes over time of a reset signal inputted to each of second integrating circuits.
Figure 12E:
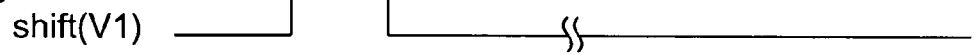
FIG. 12E is a graph showing changes over time of a signal outputted from the second shift register.
Figure 12F:
FIG. 12F is a graph showing changes over time of a signal outputted from the second shift register.
Figure 12G:
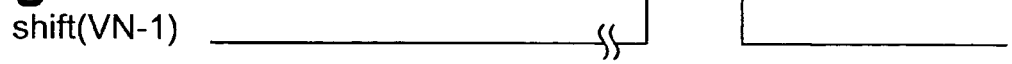
FIG. 12G is a graph showing changes over time of a signal outputted from the second shift register.
Figure 12H:
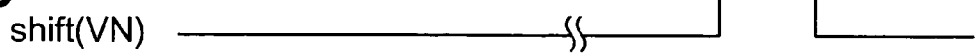
FIG. 12H is a graph showing changes over time of a signal outputted from the second shift register.
Figure 12I:
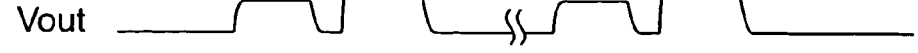
FIG. 12I is a graph showing changes over time of voltage outputted from the second signal processing circuit.

The reset signal $\Phi_{Vreset}$ is inputted to the second integrating circuit 33 from the control circuit (see FIG. 12D). While the reset signal $\Phi_{Vreset}$ is in an "OFF" state, the electric charges accumulated in the corresponding group of photosensitive portions $13_{mn}$ on the other side are accumulated in the capacitor 35. Then, voltages $V_{out}$ corresponding to amounts of the accumulated electric charges are sequentially outputted from the second integrating circuit 33 (see FIG. 12I). When the reset signal $\Phi_{Vreset}$ is in an "ON" state, the second integrating circuit 33 closes the switch 36 and resets the capacitor 35.

In this way, the second signal processing circuit 30 sequentially outputs the voltages $V_{out}$ as time-series data of each of the corresponding group of photosensitive portions $13_{mn}$ on the other side. The voltages $V_{out}$ correspond to the electric charges (electric currents) accumulated in the groups of photosensitive portions $13_{mn}$ on the other side that are electrically connected across the plurality of pixels $11_{11}$ to $11_{M1}$, $11_{12}$ to $11_{M2}$, . . . , and $11_{1N}$ to $11_{MN}$ arrayed in the second direction. This time-series data indicates a luminous profile in the first direction.

In the aforementioned way, in the photodetector 1 of the present invention, the light incident to one pixel $11_{mn}$ is outputted as an electric current from each of the plurality of photosensitive portions $12_{mn}$ and $13_{mn}$ that constitutes the pixel $11_{mn}$. The electric current corresponds to the intensity of the light sensed by each of the photosensitive portions $12_{mn}$ and $13_{mn}$. The photosensitive portions $12_{mn}$ on one side are electrically connected across the plurality of pixels $11_{11}$ to $11_{1N}$, $11_{21}$ to $11_{2N}$, . . . , and $11_{M1}$ to $11_{MN}$ arrayed in the first direction in the two-dimensional array. Hence, the electric currents outputted from the photosensitive portions $12_{mn}$ on one side is transmitted in the first direction. On the other hand, the photosensitive portions $13_{mn}$ on the other side are electrically connected across the plurality of pixels $11_{11}$ to $11_{M1}$, $11_{12}$ to $11_{M2}$, . . . , and $11_{1N}$ to $11_{MN}$ arrayed in the second direction in the two-dimensional array. Hence, the electric currents outputted from the photosensitive portions $13_{mn}$ on the other side are transmitted in the second direction. In this way, the electric currents outputted from the photosensitive portions $12_{mn}$ on one side are transmitted in the first direction, and the electric currents outputted from the photosensitive portions $13_{mn}$ on the other side are transmitted in the second direction. Accordingly, the respective luminous profiles in the first and second directions can be obtained independently. As a result, fast detection of two-dimensional positions of the incident light becomes viable with an extremely simple structure in which the plurality of photosensitive portions $12_{mn}$ and $13_{mn}$ are arrayed in one pixel.

Further, in the photodetector 1 of the present invention, each of the photosensitive portions $12_{mn}$ and $13_{mn}$ includes a portion of semiconductor substrate 40, and second conductive type semiconductor regions 41 and 42. Each of the second conductive type semiconductor regions 41 and 42 is in a shape of an approximate triangle when viewed from a light incident direction, and the approximate triangle is formed so that one side thereof is disposed adjacent to one side of another approximate triangle in one pixel. Therefore, it is possible to suppress an area reduction of each photosensitive portions $12_{mn}$ and $13_{mn}$ (second conductive type semiconductor regions 41 and 42) when the plurality of photosensitive portions $12_{mn}$ and $13_{mn}$ are arrayed within one pixel.

Furthermore, in the photodetector 1 of the present invention, each of the second conductive type semiconductor regions 41 and 42 is in a shape of an approximate rectangle when viewed from a light incident direction. The approximate rectangle is formed so that a long side thereof is disposed adjacent to a long side of another approximate rectangle in one pixel. Therefore, it is possible to suppress an area reduction of each photosensitive portions $12_{mn}$ and $13_{mn}$ (second conductive type semiconductor regions 41 and 42), when the plurality of photosensitive portions $12_{mn}$ and $13_{mn}$ are arrayed within one pixel.

Moreover, in the photodetector 1 of the present invention, each of the second conductive type semiconductor regions 41 and 42 is in a shape of a polygon with four or more angles when viewed from the light incident direction. The polygon is formed so that one side thereof is disposed adjacent to one side of another polygon in one pixel. Therefore, it is possible to suppress an area reduction of each photosensitive portions $12_{mn}$ and $13_{mn}$ (second conductive type semiconductor regions 41 and 42), when the plurality of photosensitive portions $12_{mn}$ and $13_{mn}$ are arrayed within one pixel. In addition, a peripheral length of each photosensitive portion $12_{mn}$ and $13_{mn}$ with respect to the area of the same is reduced, thereby lowering a value of dark current converted per unit area. For the polygon with four or more angles, a rhombus may also be applicable.

In the photodetector 1 of the present invention, the second conductive type semiconductor regions 41 and 42 are also placed in rows within one pixel in a third direction that intersects the first and second directions. With this type of configuration, in the groups of photosensitive portions $12_{mn}$ on one side and the photosensitive portions $13_{mn}$ on the other side, the photosensitive portions $12_{mn}$ and $13_{mn}$ corresponding to each group of photosensitive portions $12_{mn}$ and $13_{mn}$ are concentrated at the center of the corresponding group of photosensitive portions. Therefore, resolution can be improved.

Furthermore, the second conductive type semiconductor regions 41 and 42 are arrayed in a honeycomb structure when viewed from the light incident direction. With this structure, it is possible to further suppress an area reduction of each photosensitive portions $12_{mn}$ and $13_{mn}$ (second conductive type semiconductor regions 41 and 42), when the plurality of photosensitive portions $12_{mn}$ and $13_{mn}$ are disposed within one pixel. In addition, since this structure has high geometrical symmetry, it is possible to suppress ununiformity due to displacement of a mask used for forming the second conductive type semi conductor regions 41 and 42 (photosensitive portions $12_{mn}$ and $13_{mn}$)

Moreover, in the photodetector 1 of the present invention, the first wire 44 is provided between the pixels $11_{mn}$, while extending in the first direction, and the second wire 47 is provided between pixels $11_{mn}$, while extending in the second direction. With this type of configuration, each of the wires 44 and 47 will not prevent light from being incident on the photosensitive portions $12_{mn}$ and $13_{mn}$ (second conductive type semiconductor regions 41 and 42), thus suppressing deterioration in detection sensitivity.

Moreover, the photodetector 1 of the present invention further includes the first shift register 22, the second shift register 32, the first integrating circuit 23, and the second integrating circuit 33. This configuration makes it possible to obtain the luminous profiles in the first and second directions with an extremely simple structure.

Figure 13:
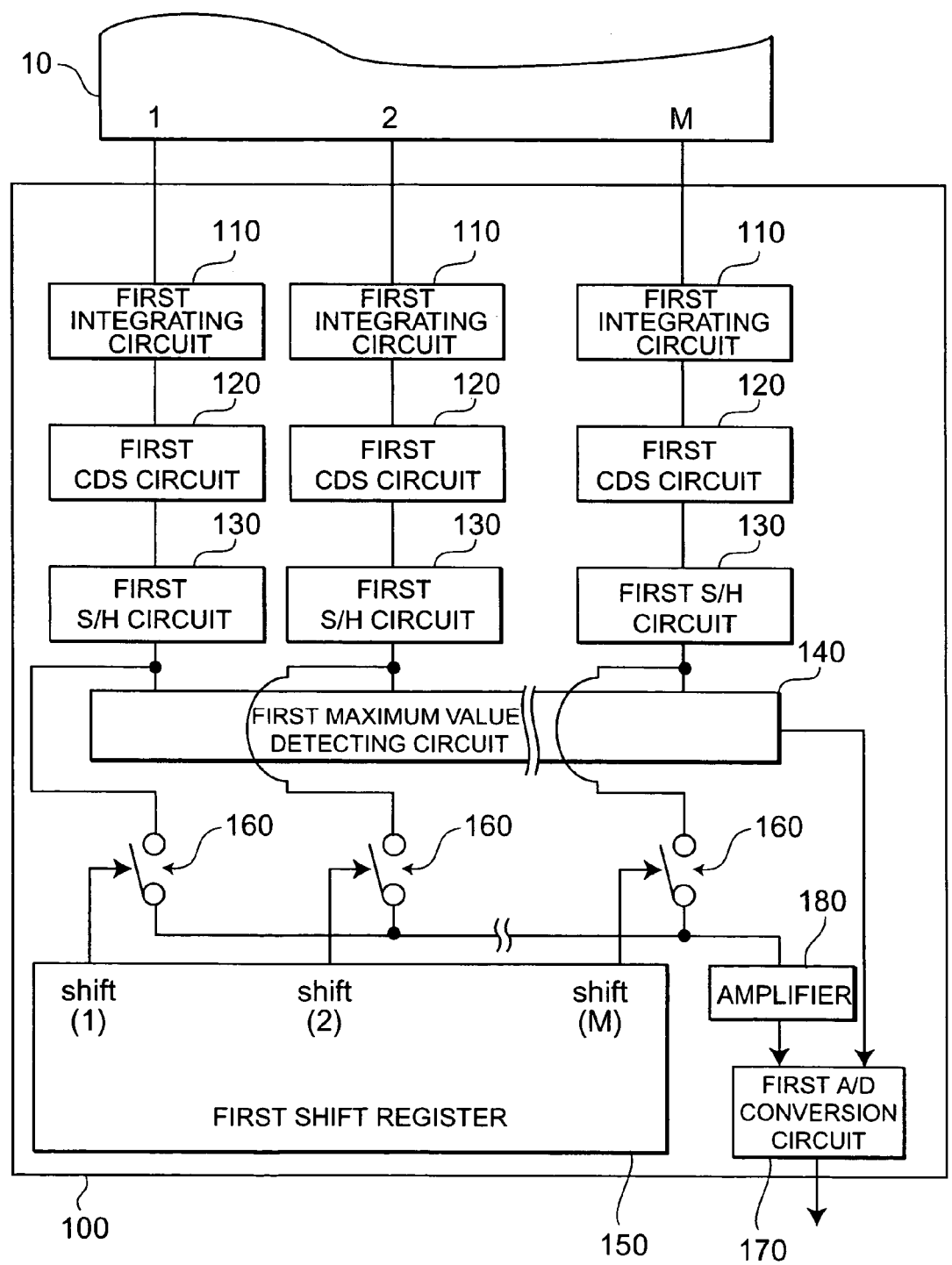
FIG. 13 is a schematic block diagram showing a modification example of the first signal processing circuit included in the photodetector according to the present embodiment.
Figure 14:
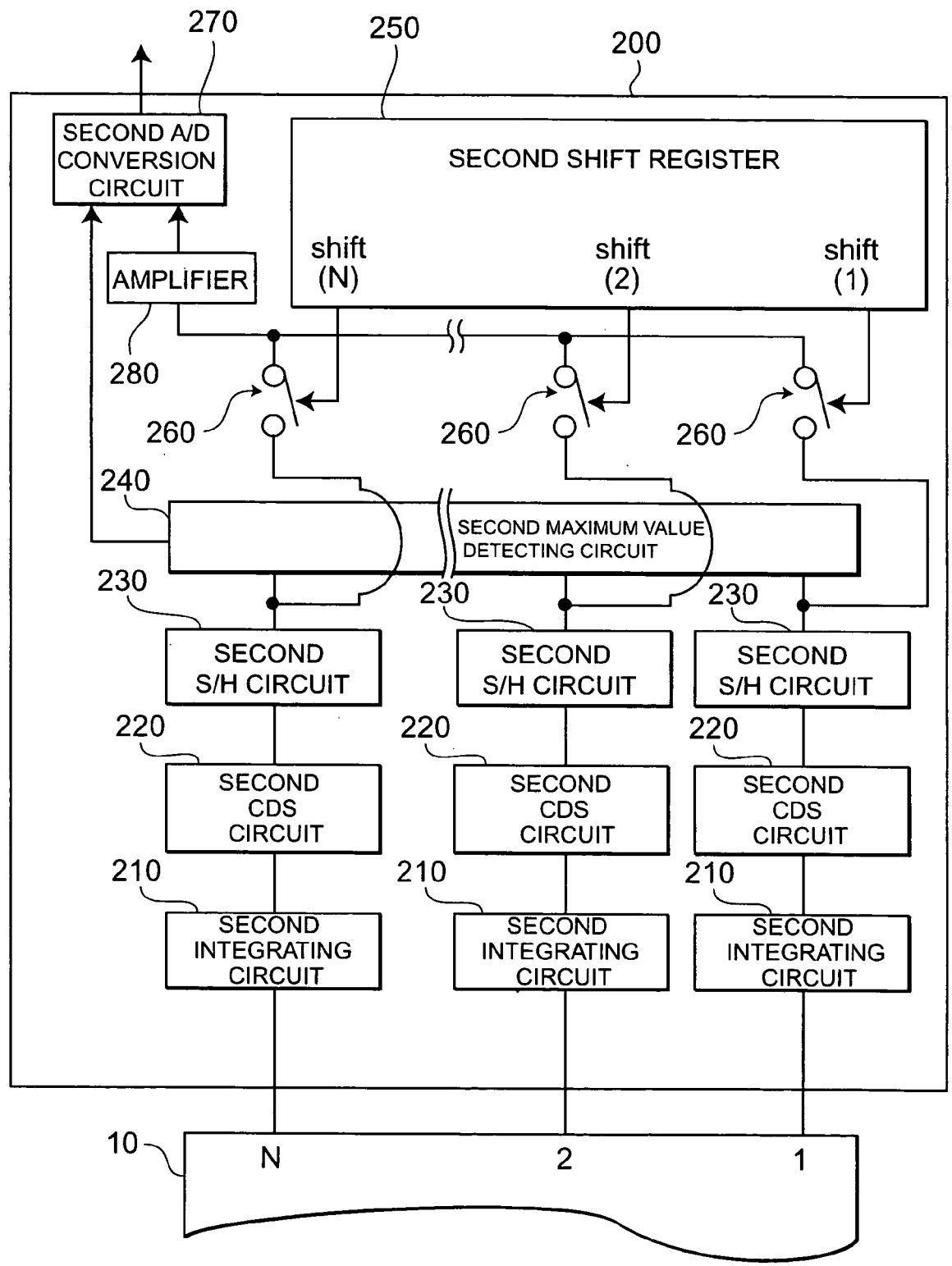
FIG. 14 is a schematic block diagram showing a modification example of the second signal processing circuit included in the photodetector according to the present embodiment.

Next, configurations of modification examples of the first and second signal processing circuits will be described based on FIGS. 13 and 14. FIG. 13 is a schematic block diagram showing the modification example of the first signal processing circuit. FIG. 14 is a schematic block diagram showing the modification example of the second signal processing circuit.

As shown in FIG. 13, the first signal processing circuit 100 includes: first integrating circuits 110; first CDS circuits 120; first sample-and-hold circuits (first S/H circuits) 130; a first maximum value detecting circuit 140; a first shift register 150; first switches 160; and a first A/D conversion circuit 170.

Figure 15:
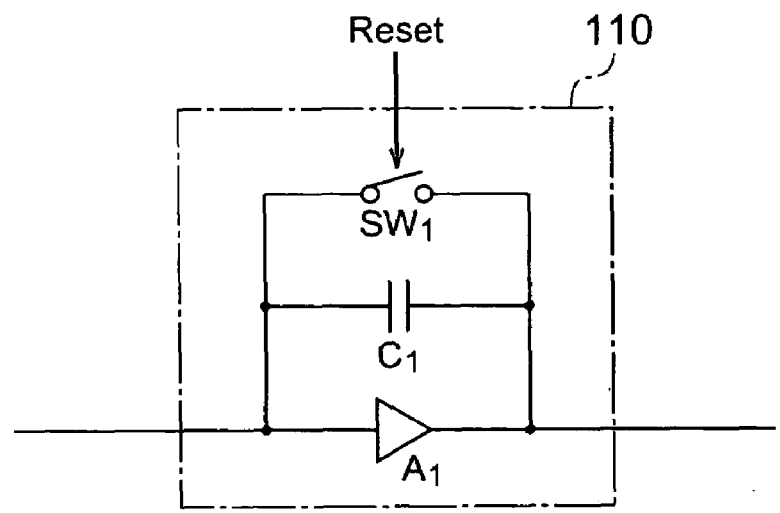
FIG. 15 is a circuit diagram showing one of the first integrating circuits included in the modification example of the first signal processing circuit.

The first integrating circuits 110 are provided corresponding to respective groups of photosensitive portions $12_{mn}$ on one side (M columns of photosensitive portions configured of the second conductive type semiconductor regions 41 on one side, long extending in the first direction). These photosensitive portions $12_{mn}$ are electrically connected across the plurality of pixels $11_{11}$ to $11_{1N}$, $11_{21}$ to $11_{2N}$, . . . , and $11_{M1}$ to $11_{MN}$ arrayed in the first direction. The first integrating circuits 110 convert electric currents from the corresponding groups of the photosensitive portions $12_{mn}$ on one side into voltages, and output the voltages. As shown in FIG. 15, in the first integrating circuit 110, an amplifier $A_1$, a capacitor $C_1$, and a switch $SW_1$ are parallel-connected to each other between input and output terminals of the first integrating circuit 110. When the switch $SW_1$ is closed, each of the first integrating circuits 110 discharges electricity and reset the capacitor $C_1$. On the other hand, when the switch $SW_1$ is opened, each of the first integrating circuits 110 accumulates electric charges inputted to the input terminal, in the capacitor $C_1$, and then outputs voltages corresponding to the accumulated electric charges from the output terminal. The switch $SW_1$ is opened or closed based on a Reset signal outputted from a control circuit (not shown).

Figure 16:
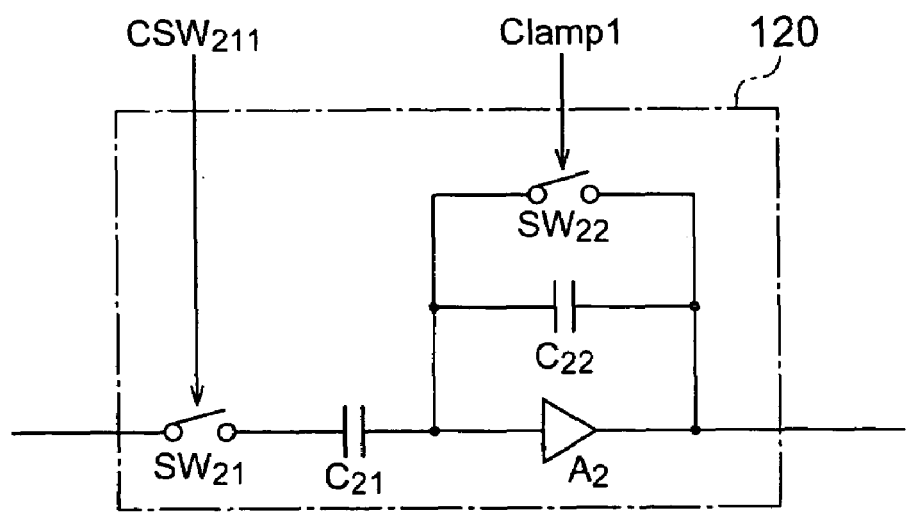
FIG. 16 is a circuit diagram showing one of first CDS circuits included in the modification example of the first signal processing circuit.

The first CDS circuits 120 are provided corresponding to the respective first integrating circuits 110, and output voltages with values defined according to variations of the voltages outputted from the corresponding first integrating circuits 110. As shown in FIG. 16, each of the first CDS circuits 120 includes a switch $SW_{21}$, a coupling capacitor $C_{21}$, and an amplifier $A_2$ between input and output terminals of the first CDS circuit 120. In addition, a switch $SW_{22}$ and an integrating capacitor $C_{22}$ are parallel-connected to each other between input and output terminals of the amplifier $A_2$. Each of the switch $SW_{22}$ and $SW_{21}$ acts as switches for accumulating the electric charges in the integrating capacitor $C_{22}$. When the switch $SW_{22}$ is closed, each of the first CDS circuits 120 discharges electricity and resets the integrating capacitor $C_{22}$. When the switch $SW_{22}$ is opened and the switch $SW_{21}$ is closed, each of the first CDS circuits 120 accumulates the electric charges inputted from the input terminal via the coupling capacitor $C_{21}$, in the integrating capacitor $C_{22}$. Then, voltages corresponding to the accumulated electric charges are outputted from the output terminal.

The switch $SW_{21}$ is opened or closed based on a CSW211 signal outputted from a control circuit. The switch $SW_{22}$ is opened or closed based on a Clamp1 signal outputted from the control circuit.

Figure 17:
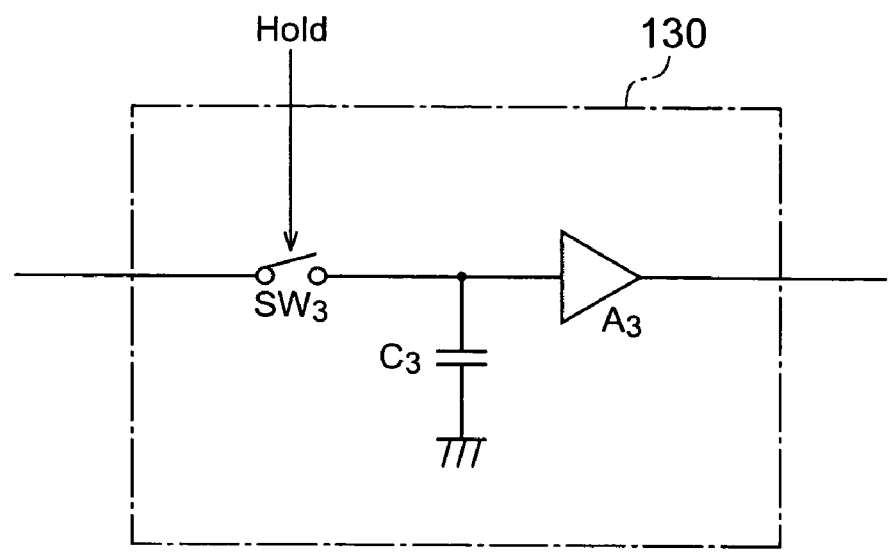
FIG. 17 is a circuit diagram showing one of first S/H circuits included in the modification example of the first signal processing circuit.

The first S/H circuits 130 are provided corresponding to the respective first CDS circuits 120. The first S/H circuits 130 hold the voltages outputted from the corresponding first CDS circuits 120 and then output the voltages. As shown in FIG. 17, each of the first S/H circuits 130 includes a switch $SW_3$ and an amplifier $A_3$, and a node between the switch $SW_3$ and the amplifier $A_3$ is grounded through a capacitor $C_3$. When the switch $SW_3$ is closed, each of the first S/H circuits 130 stores the voltages outputted from the first CDS circuits 120 in the capacitor $C_3$. Even after the switch $SW_3$ is opened, each of the first S/H circuits 130 holds the voltages stored in the capacitor $C_3$ and outputs the voltages through the amplifier $A_3$. The switch $SW_3$ is opened or closed based on a Hold signal outputted from a control circuit. The first switches 160 are sequentially closed by control of the first shift register 150, and allow the voltages outputted from the first S/H circuits 130 to be sequentially inputted to the first A/D conversion circuit.

Figure 18:
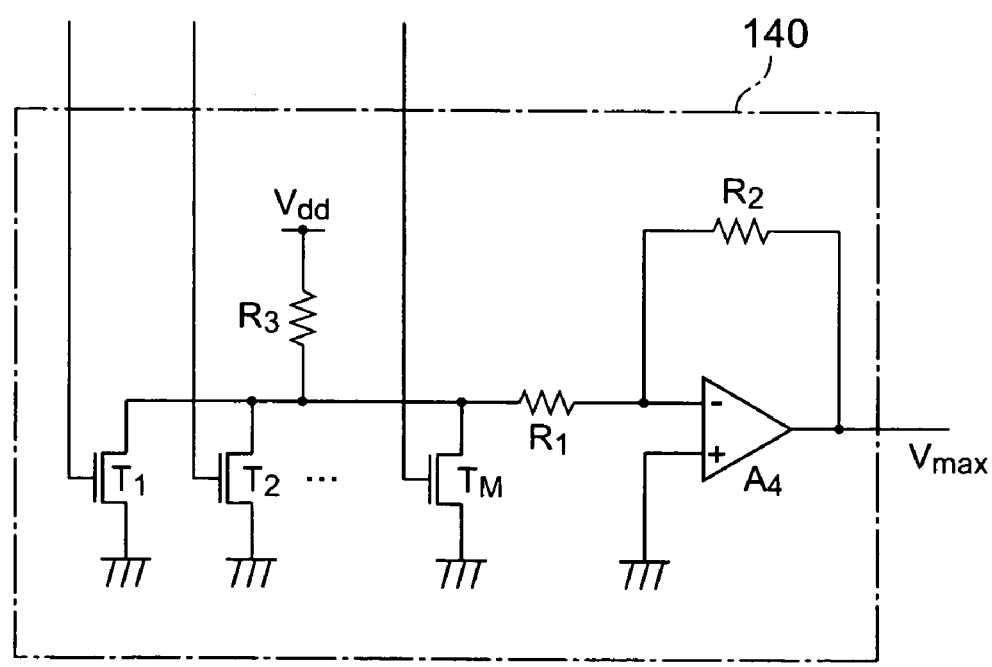
FIG. 18 is a circuit diagram showing a first maximum value detecting circuit included in the modification example of the first signal processing circuit.

The first maximum value detecting circuit 140 detects maximum value of the voltages outputted from each of the first S/H circuits 130. As shown in FIG. 18, the first maximum value detecting circuit 140 includes NMOS transistors $T_1$ to $T_M$, resistors $R_1$ to $R_3$, and a differential amplifier $A_4$. Source terminals of the respective transistors $T_m$ are grounded, and drain terminals of the respective transistors $T_m$ are connected to a supply voltage Vdd through the register $R_3$ and to an inverted input terminal of the differential amplifier $A_4$ through the register $R_1$. Gate terminals of the respective transistors $T_m$ are connected to output terminals of the first S/H circuits 130, and voltages outputted from the first S/H circuits 130 are inputted to the gate terminals. Moreover, the register $R_2$ is provided between an inverted input terminal and an output terminal of the differential amplifier $A_4$, while a non-inverted input terminal of the differential amplifier $A_4$ is grounded. In this first maximum value detecting circuit 140, the voltages outputted from the first S/H circuits 130 are inputted to the gate terminals of the transistors $T_m$, and electric potentials corresponding to maximum values out of the respective voltages appear at the drain terminals of the transistors $T_m$. Thereafter, the electric potentials in the drain terminals are amplified by the differential amplifier $A_4$, and amplified voltage values are outputted as maximum voltage values $V_{max}$ to the first A/D converting circuit 170 from the output terminal.

Figure 19:
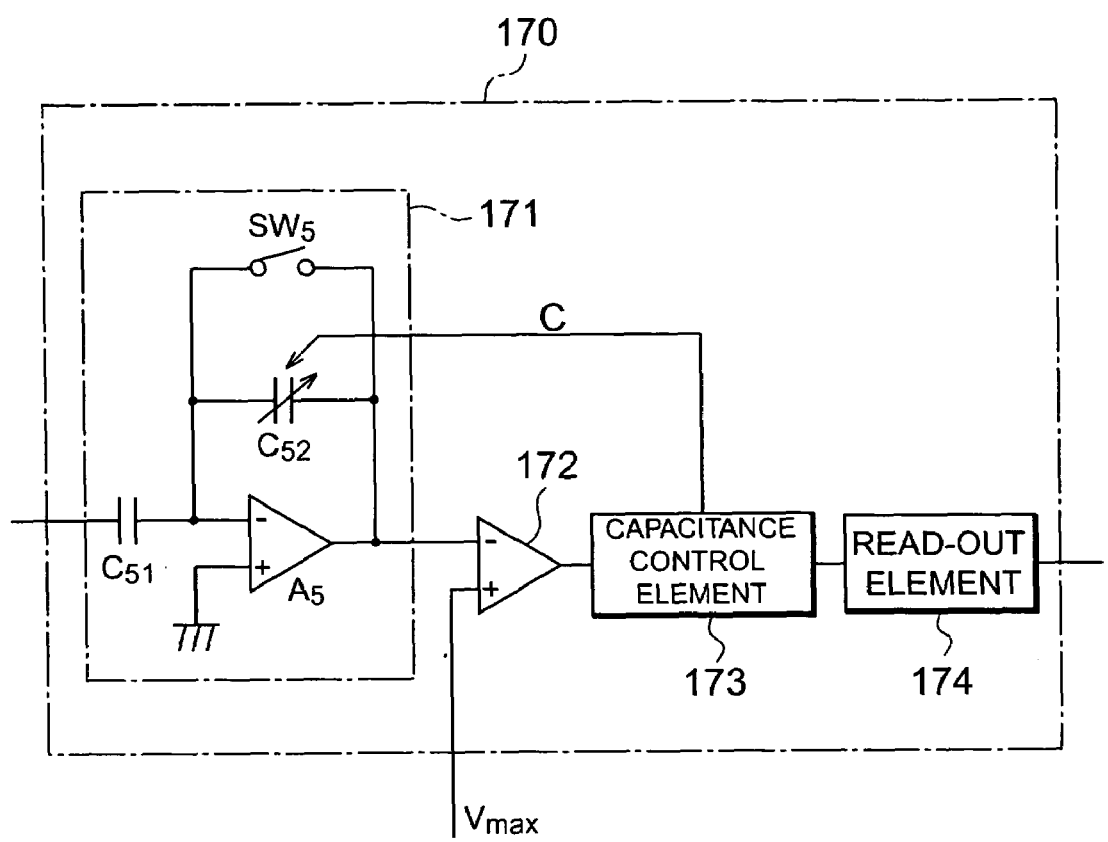
FIG. 19 is a circuit diagram showing a first A/D conversion circuit included in the modification example of the first signal processing circuit.

The voltages outputted from each of the first S/H circuits 130 are sequentially inputted to the first A/D conversion circuit 170, in which the voltages are converted into digital values based on the maximum value detected in the first maximum value detecting circuit 140. The digital values are then outputted. The maximum voltage value $V_{max}$ outputted from the first maximum value detecting circuit 140 is inputted to the first A/D conversion circuit 170 to be taken as A/D conversion ranges. Thereafter, the voltages outputted from the first S/H circuits 130 are sequentially inputted to the first A/D conversion circuit 170 through the first switches 160 and the amplifier 180. The first A/D conversion circuit 170 then converts the voltages (analog values) into digital values and subsequently outputs the digital values. As shown in FIG. 19, the first A/D conversion circuit 170 includes a variable capacitance integrating circuit 171, a comparator 172, a capacitance control element 173, and a read-out element 174.

Variable capacitance integrating circuit 171 includes a capacitor $C_{51}$, an amplifier $A_5$, a variable capacitor $C_{52}$, and a switch $SW_5$. The voltages, which are outputted from the first S/H circuits 130 and sequentially reach the first A/D conversion circuit 170 through the first switches 160, are inputted to an inverted input terminal of the amplifier $A_5$ through the capacitor $C_{51}$. A non-inverted input terminal of the amplifier $A_5$ is grounded. The variable capacitor $C_{52}$, in which a capacitance is variable as well as controllable, is provided between the inverted input terminal and an output terminal of the amplifier $A_5$, and stores electric charges according to the inputted voltages. The switch $SW_5$ is provided between the inverted input terminal and the output terminal of the amplifier $A_5$. When the switch $SW_5$ is opened, the switch $SW_5$ causes the variable capacitor $C_{52}$ to store electric charges. When closed, the switch $SW_5$ resets the electric charges stored in the variable capacitor $C_{52}$. After the voltages sequentially outputted from the first S/H circuits 130 are inputted to the variable capacitance integrating circuit 171, the variable capacitance integrating circuit 171 integrates the voltages according to the capacitance of the variable capacitor $C_{52}$, and outputs voltages which are results of the integration.

The voltage output from the variable capacitance integrating circuit 171 is inputted to an inverted input terminal of the comparator 172. The maximum voltage values $V_{max}$ outputted from the first maximum value detecting circuit 140 are inputted to a non-inverted input terminal of the comparator 172. The comparator 172 then compares these two values of the inputted voltages, and outputs a comparison result signal which is a result of the comparison.

This comparison result signal outputted from the comparator 172 is inputted to the capacitance control element 173. Based on the comparison result signal, the capacitance control element 173 then outputs a capacitance indication signal C for controlling the capacitance of the variable capacitor $C_{52}$. At the same time, the capacitance control element 173 outputs a first digital value corresponding to a capacitance value of the variable capacitor $C_{52}$, if the voltage value which is a result of the integration and the maximum voltage values $V_{max}$ are determined to be identical by a given resolving power.

The first digital value outputted from the capacitance control element 173 is inputted to the read-out element 174, which then outputs a second digital value corresponding to the first digital value. The second digital value indicates a value obtained by subtracting an offset value of the variable capacitance integrating circuit 171 from the first digital value. The read-out element 174 is, for example, a memory element, to which the first digital value is inputted as an address. The read-out element 174 then outputs data stored in the address in the memory element as the second digital value. The second digital value becomes an output indicating a luminous profile in the second direction.

As shown in FIG. 14, the second signal processing circuit 200 includes: second integrating circuits 210; second CDS circuits 220; second sample-and-hold circuits (second S/H circuits) 230; a second maximum value detecting circuit 240; a second shift register 250; second switches 260; and a second A/D conversion circuit 270.

The second integrating circuits 210 are provided corresponding to respective groups of photosensitive portions $13_{mn}$ on one side (N rows of photosensitive portions configured of the second conductive type semiconductor regions 42 on the other side, long extending in the second direction). These photosensitive portions $13_{mn}$ are electrically connected across the plurality of pixels $11_{11}$ to $11_{M1}$, $11_{12}$ to $11_{M2}, \ldots,$ and $11_{1N}$ to $11_{MN}$ arrayed in the second direction. The second integrating circuits 210 convert electric currents from the corresponding groups of photosensitive portions $13_{mn}$ on the other side into voltages, and output the voltages. The second integrating circuit 210 has the same configuration as that of the first integrating circuit 110 shown in FIG. 15. In each of the second integration circuits 210, an amplifier, a capacitor, and a switch are parallel-connected to each other between input and output terminals of the second integration circuit 210.

The second CDS circuits 220 are provided corresponding to the respective second integrating circuits 210, and output voltages with values defined according to variations in values of the voltages outputted from the corresponding second integrating circuits 210. The second CDS circuit 220 has the same configuration as that of the first CDS circuit 120 shown in FIG. 16. Each of the second CDS circuits 220 includes a switch, a coupling capacitor, and an amplifier between input and output terminals of the second CDS circuit 220. In addition, a switch and an integrating capacitor are parallel-connected to each other between input and output terminals of the amplifier.

The second S/H circuits 230 are provided corresponding to the respective second CDS circuits 220. The second S/H circuits 230 hold the voltages outputted from the corresponding second CDS circuits 220 and then output the voltages. The second S/H circuit 230 has the same configuration as that of the first S/H circuit 130 shown in FIG. 17. Each of the second S/H circuits 230 includes a switch and an amplifier, and a node between the switch and the amplifier is grounded through a capacitor. The second switches 260 are sequentially opened by control of the second shift register 250, and allow the voltages outputted from the second S/H circuits 230 to be sequentially inputted to the second A/D conversion circuit 270.

The second maximum value detecting circuit 240 detects maximum value of the voltages outputted from each of the second S/H circuits 230. The second maximum value detecting circuit 240 has the same configuration as that of the first maximum value detecting circuit 140 shown in FIG. 18. The second maximum value detecting circuit 240 includes NMOS transistors, resistors, and a differential amplifier. Source terminals of the respective transistors are grounded, and drain terminals of the respective transistors are connected to a supply voltage through one of the resistors and to an inverted input terminal of the differential amplifier through an other one of the resistors. Gate terminals of the respective transistors are connected to output terminals of the second S/H circuits, and voltages outputted from the second S/H circuits are inputted to the gate terminals. Moreover, another one of the resistors is provided between an inverted input terminal and an output terminal of the differential amplifier, whereas non-inverted input terminal of the differential amplifier is grounded.

The voltages outputted from the second S/H circuits 230 are sequentially inputted to the second A/D conversion circuit 270, in which the voltages are converted into digital values based on the maximum values detected in the second maximum value detecting circuit 240. The digital values are then outputted. The maximum voltages outputted from the second maximum value detecting circuit 240 are inputted to the second A/D conversion circuit 270, and the maximum voltages are taken as A/D conversion ranges. Thereafter, the voltages outputted from the second S/H circuits 230 are sequentially inputted to the second A/D conversion circuit 270 through the second switches 260. The second A/D conversion circuit 270 then converts the voltages (analog values) into digital values and subsequently outputs the digital values. The second A/D conversion circuit 270 has the same configuration as that of the first A/D conversion circuit 170 shown in FIG. 19, and includes a variable capacitance integrating circuit, a comparator, a capacitance control element, and a read-out element. The second digital value outputted from the second A/D conversion circuit 270 becomes an output indicating a luminous profile in the first direction.

As hitherto described, the maximum voltage values $V_{max}$, which are outputted from the respective first and second maximum value detecting circuits 140 and 240, and subsequently inputted to the respective comparators 172, defines A/D conversion ranges, i.e. maximum values of the voltages, with which the first and second A/D conversion circuits 170 and 270 can perform A/D conversion without saturation. Furthermore, it is always the case that any of voltages inputted to the first and second A/D conversion circuits 170 and 270 are the maximum voltage values $V_{max}$. Therefore, the general A/D range can be effectively utilized. Specifically, the photodetector 1 according to the present embodiment has a superior resolution power of the A/D conversion not only when a light intensity is high, but also when a light intensity is low.

Moreover, even if each of the first and second integrating circuits 110 and 120 has different noise variations per integration operation, noises are canceled by the first and second CDS circuits 120 and 220.

Additionally, the first and second integrating circuits 110 and 120 are provided corresponding to the respective groups of photosensitive portions $12_{mn}$ and $13_{mn}$. Therefore, the electric charges from the respective groups of the photosensitive portions $12_{mn}$ and $13_{mn}$ can be accumulated simultaneously, and the electric charges can be converted into voltages.

As a result of the foregoing, the luminous profiles in the first and second direction can be obtained quickly as well as highly accurately. Incidentally, in Japanese Patent Laid-Open Publication No. 2001-36128 applied by the present applicant discloses operations of the aforementioned first and second integration circuit 110 and 210, the first and second CDS circuit 120 and 220, the first and second S/H circuits 130 and 230, the first and second maximum value detecting circuits 140 and 240, the first and second shift registers 150 and 250, the first and second switches 160 and 260, the first and second A/D conversion circuits 170 and 270, and the like.

Figure 21:
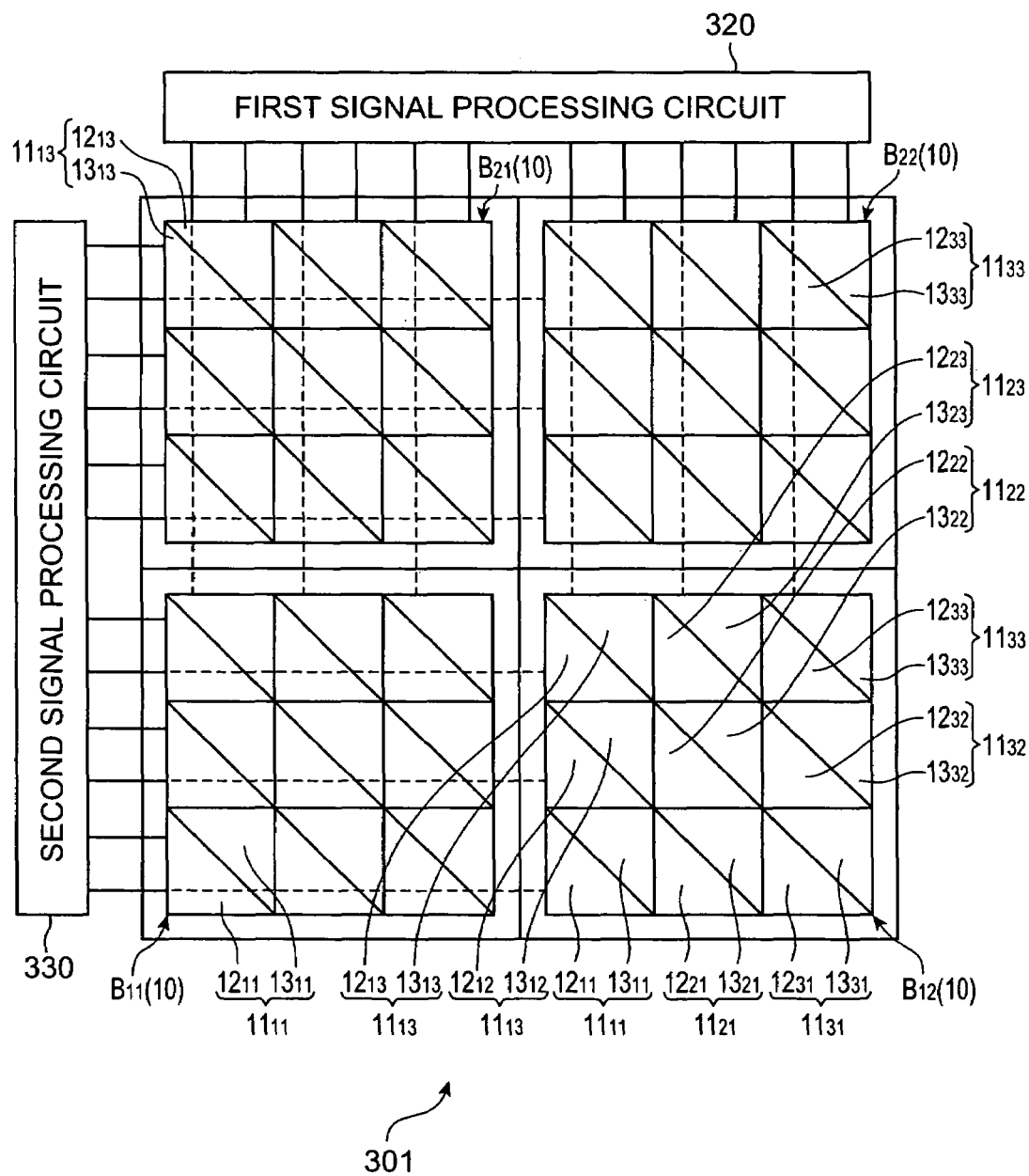
FIG. 21 is a conceptual schematic diagram showing a configuration of an imaging device according to the present embodiment.
Figure 22:
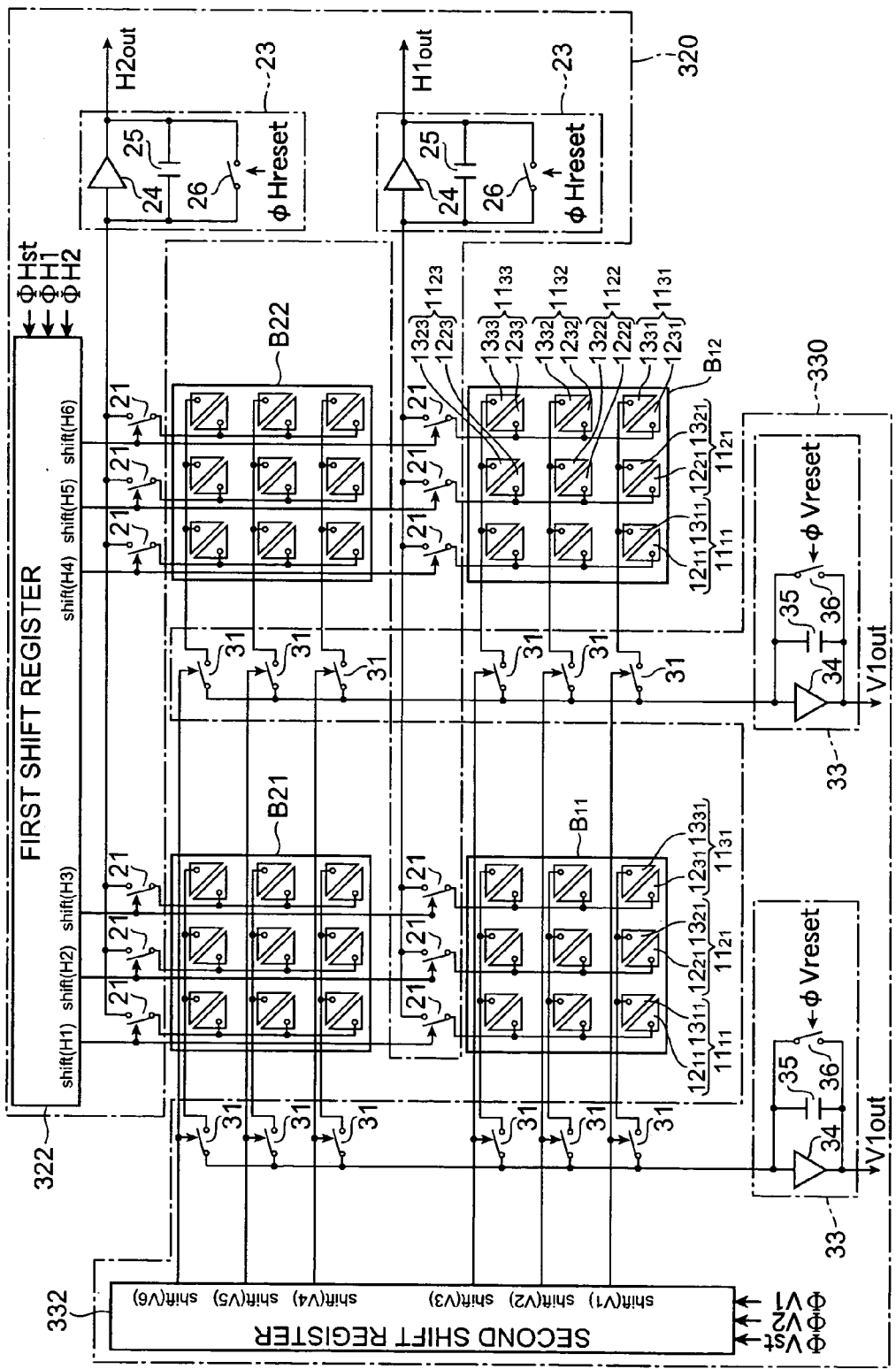
FIG. 22 is a conceptual schematic diagram showing a configuration of the imaging device according to the present embodiment.

Next, an imaging device according to the present embodiment will be described based on the FIGS. 21 and 22. FIGS. 21 and 22 are schematic block diagrams showing the imaging device. In FIGS. 21 and 22, imaging blocks (photosensitive regions) are illustrated as those in a 2×2 arrangement, and the pixels within each of the imaging blocks are illustrated as those in a $_{3\times3}$ arrangement, to simplify a description of the embodiment. As a matter of course, the photosensitive regions may be in a P×Q arrangement and the pixels within each of the photosensitive regions may be in an M×N arrangement (note that each of P and Q is an integer of two or grater).

As shown in FIGS. 21 and 22, the imaging device 301 according to the present embodiment includes imaging blocks $B_{11}$ to $B_{22}$ (photosensitive region 10) which are two-dimensionally arranged with two columns and two rows, and the first and second signal processing circuits 320 and 330. The first and second signal processing circuits 320 and 330 may be operated either simultaneously or independently in a time-series order.

The first signal processing circuit 320 outputs voltages H1$_{out}$ and H2$_{out}$ per each group of the imaging blocks configured by the plurality of imaging blocks (e.g. imaging blocks B$_{11}$ and B$_{12}$) arrayed in the second direction. The voltages H1$_{out}$ and H2$_{out}$ indicate luminous profiles in the second direction, regarding light incident on imaging regions (imaging blocks B$_{11}$ to B$_{22}$). The first signal processing circuit 320 outputs the voltage H1$_{out}$ as an output from a group of imaging blocks configured by the imaging blocks B$_{11}$ and B$_{12}$. The first signal processing circuit 320 also outputs the voltage H2$_{out}$ as an output from a group of imaging blocks configured by the imaging blocks B$_{21}$ and B$_{22}$.

The second signal processing circuit 330 outputs voltages V1$_{out}$ and V2$_{out}$ per each group of the imaging blocks configured by the plurality of imaging blocks (e.g. imaging blocks B$_{11}$ and B$_{21}$) arrayed in the first direction. These voltages V1$_{out}$ and V2$_{out}$ indicate luminous profiles in the first direction, regarding light incident on imaging regions (imaging blocks B$_{11}$ to B$_{22}$). The second signal processing circuit 330 outputs the voltage V1$_{out}$ as an output from a group of imaging blocks configured by the imaging blocks B$_{11}$ and B$_{21}$. The second signal processing circuit 330 also outputs the voltage V2$_{out}$ as an output from a group of imaging blocks configured by the imaging blocks B$_{12}$ and B$_{22}$.

The first signal processing circuit 320 includes first switches 21, a first shift register 322, and first integrating circuits 23. The first shift register 322 has an equivalent function to that of the first shift register 22 described earlier. The first shift register 322 sequentially reads electric currents in the second direction per each group of imaging blocks configured by the plurality of imaging blocks (e.g. imaging blocks B$_{11}$ and B$_{12}$) arrayed in the second direction. The electric currents are from groups of photosensitive portions 12$_{mn}$ (12$_{11}$ to 12$_{13}$, 12$_{21}$ to 12$_{23}$, and 12$_{31}$ to 12$_{33}$) on one side which are electrically connected across the plurality of pixels 11$_{11}$ to 11$_{13}$, 11$_{21}$ to 11$_{23}$, and 11$_{31}$ to 11$_{33}$ arrayed in the first direction. The first switches 21 are sequentially closed by control of signals shift (H1) to shift (H6) outputted from the first shift register 322. The first integrating circuit 23 is provided for each group of imaging blocks configured by the plurality of imaging blocks (e.g. imaging blocks B$_{11}$ and B$_{12}$) arrayed in the second direction.

The second signal processing circuit 330 includes second switches 31, a second shift register 332, and second integrating circuits 33. The second shift register 332 has an equivalent function to that of the second shift register 32 described earlier. The second shift register 332 sequentially reads electric currents in the first direction per each group of imaging blocks configured by the plurality of imaging blocks (e.g. imaging blocks B$_{11}$ and B$_{21}$) arrayed in the first direction. The electric currents are from groups of photosensitive portions 13$_{mn}$ (13$_{11}$ to 13$_{31}$, 13$_{12}$ to 13$_{32}$, and 13$_{13}$ to 12$_{33}$) on the other side which are electrically connected across the plurality of pixels 11$_{11}$ to 11$_{31}$, 11$_{12}$ to 11$_{32}$, and 11$_{13}$ to 11$_{33}$ arrayed in the second direction. The second switches 31 are sequentially closed by control of signals shift (V1) to shift (V6) outputted from the second shift register 332. The second integrating circuit 33 is provided for each group of imaging blocks configured by the plurality of imaging blocks (e.g. imaging blocks B$_{11}$ and B$_{21}$) arrayed in the first direction.

Next, operations of the first signal processing circuit 320 and the second signal processing circuit 330 will be described based on FIGS. 23A to 23J and FIGS. 24A to 24J. FIGS. 23A to 23J are timing charts for explaining the operations of the first signal processing circuit. FIGS. 24A to 24J are timing charts for explaining the operations of the second signal processing circuit.

After a start signal $\Phi_{Hst}$ is inputted to the first shift register 322 from a control circuit (see FIG. 23A), signals shifts (H1) to shift (H6), each having a pulse width corresponding to a duration from a rise of the signal $\Phi_{H2}$ to a fall of the signal $\Phi_{H1}$, are sequentially outputted (see FIG. 23B and 23C, and FIGS. 23E to 23H). When the first shift register 322 outputs the shift (H1) to shift (H6) to the corresponding first switches 21, the first switches 21 are sequentially closed. Thereafter, electric charges accumulated in the corresponding groups of photosensitive portion 12$_{mn}$ on one side are turned into electric currents and sequentially outputted to the corresponding first integrating circuits 23.

A reset signal $\Phi_{Hreset}$ is inputted to each of the first integrating circuits 23 from a control circuit (see FIG. 23D). While the reset signal $\Phi_{Hreset}$ is in an "OFF" state, the electric charges accumulated in the corresponding groups of photosensitive portions 12$_{mn}$ on one side are accumulated in capacitors 25. Then, voltages H1$_{out}$ and H2$_{out}$ in accordance with amounts of the accumulated electric charges are sequentially outputted from the respective first integrating circuits 23 (see FIGS. 23I and 23J). When the reset signal $\Phi_{Hreset}$ is in an "ON" state, each of the first integrating circuits 23 closes the switches 26 and resets the capacitors 25.

After a start signal $\Phi_{Vst}$ is inputted to the second shift register 332 from a control circuit (see FIG. 24A), signals shift (V1) to shift (V6), each having a pulse width corresponding to a duration from a rise of the signal $\Phi_{V2}$ to a fall of the signal $\Phi_{V1}$, are sequentially outputted (see FIGS. 24B and 24C, and FIGS. 24E to 24H). When the second shift register 332 outputs the shift (V1) to shift (V6) to the corresponding second switches 31, the second switches 31 are sequentially closed. Thereafter, electric charges accumulated in the corresponding groups of photosensitive portions 13$_{mn}$ on the other side are turned into electric currents and sequentially outputted to the corresponding second intergrating circuits 33.

The reset signal $\Phi_{Vreset}$ is inputted to each of the second integrating circuits 33 from a control circuit (see FIG. 24D). While the reset signal $\Phi_{Vreset}$ is in an "OFF" state, the electric charges accumulated in the corresponding groups of photosensitive portions 13$_{mn}$ on the other side are accumulated in capacitors 35. Then, voltages V1$_{out}$ and V2$^{out}$ in accordance with amounts of the accumulated electric charges are sequentially outputted from the respective second integrating circuits 33 (see FIGS. 24I and 24J). When the reset signal $\Phi_{Vreset}$ is in an "ON" state, each of the second integrating circuits 33 closes the switch 36 and resets the capacitors 35.

In the imaging device 301 of the present embodiment, the imaging blocks B$_{11}$ to B$_{22}$ (photosensitive region 10) are two-dimensionally arranged in the foregoing manner. Therefore, luminous profiles of incident light can be quickly detected with an extremely simple structure.

Figure 25:
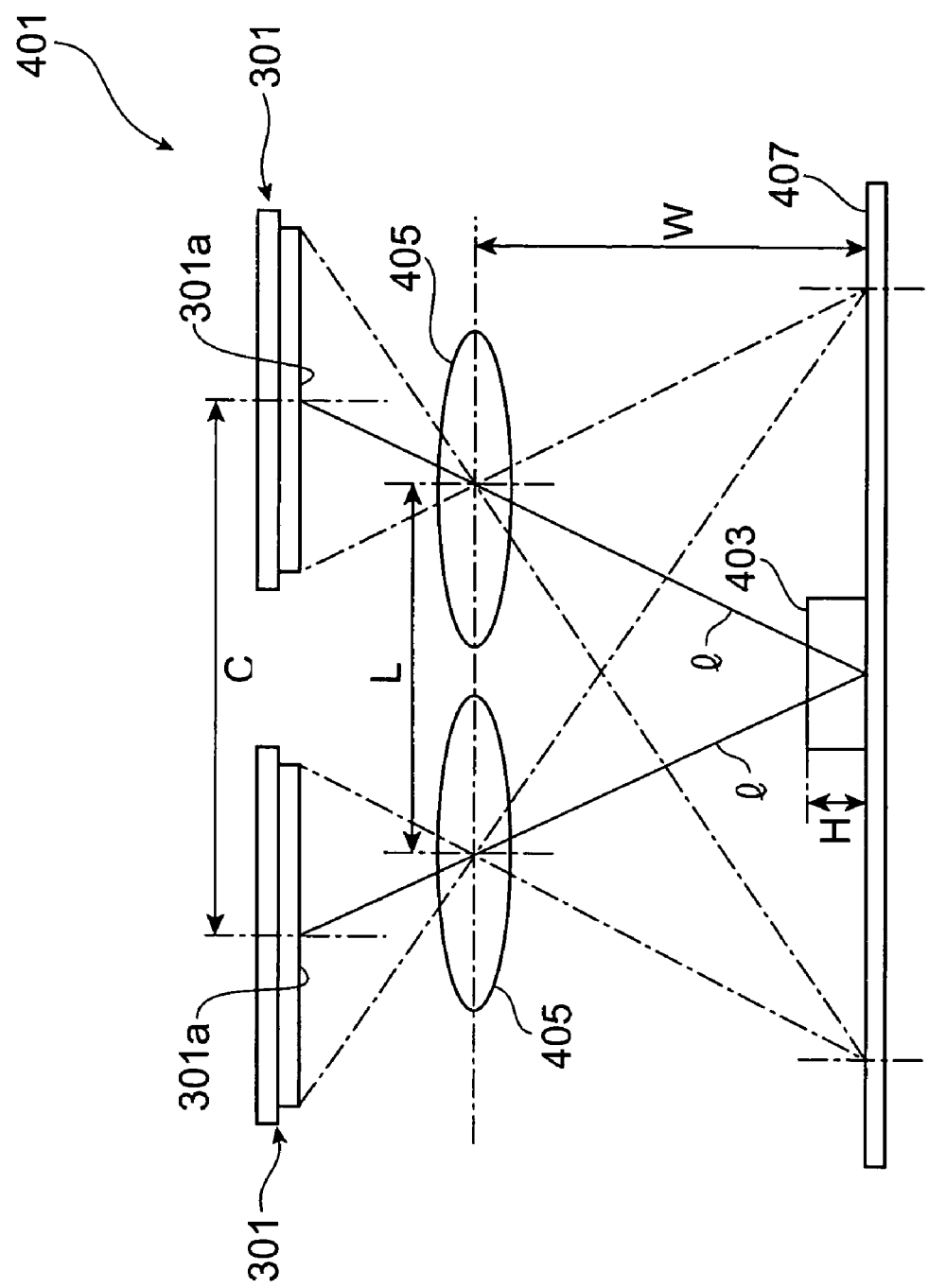
FIG. 25 is a schematic block diagram showing a configuration of a range image capture device according to the present embodiment.
Figure 26:
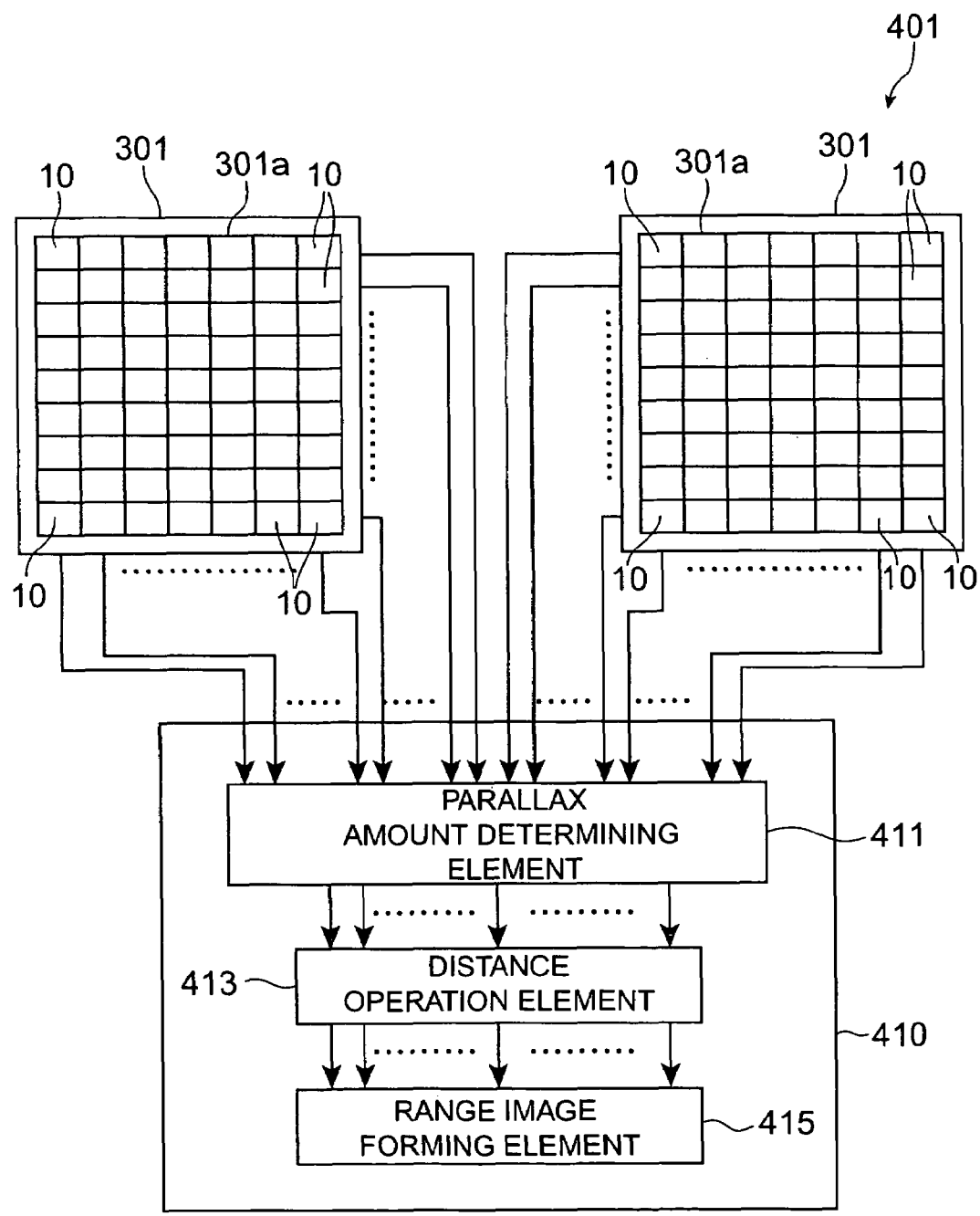
FIG. 26 is a schematic block diagram showing a configuration of the range image capture device according to the present embodiment.

Next, the range image capture device according to the present embodiment will be described based on FIGS. 25 and 26. FIGS. 25 and 26 are schematic block diagrams showing the range image capture device.

As shown in FIG. 25, in the range image capture device 401 according to the present embodiment, a pair of the aforementioned imaging devices 301 is arranged at a predetermined interval. An image of an object 403 is captured by the pair of imaging devices 301. In each of the imaging devices 301, the imaging blocks (photosensitive region 10) are in a P×Q arrangement in an imaging region 301a.

Additionally, the pixels in each of the imaging blocks (photosensitive region 10) are configured in an M×N arrangement. Here, a parameter p is any integer of 1 or greater but not exceeding P, and a parameter q is any integer of 1 or greater but not exceeding Q.

A pair of optical lenses 405 is arranged in the front of two imaging devices 301. When the object 403 is placed on a reference plane 407, optical axes 1 intersect at the center of the reference plane 407 so that the image of the object 403 is reflected at the same position in each of the imaging regions 301a of the imaging devices 301.

The height H of the object 403 with respect to the reference plane 407 is obtained in the following equation (1), regarding an amount of parallax P:

$$H=W*P/(C+P-L) \tag{1}$$

where "W" represents a distance between the optical lenses 405 and the object 403, "L" represents a distance between the optical lenses 405, and "C" represents a distance between the centers of the imaging regions 301a in the imaging devices 301. The amount of parallax for each of the imaging blocks in the imaging devices 301 can be obtained by the use of Phase-only Correlation (POC), etc.

Further, as shown in FIG. 26, the range image capture device 401 includes an operational circuit element 410. An outputs $Hp_{out}$ from each of the first integrating circuits (not shown) in the imaging devices 301, and an outputs $Vq_{out}$ from each of the second integrated circuits (not shown) are inputted to the operational circuit element 410. This operational circuit element 410 has a parallax amount determining element 411 as parallax amount determining means, a distance operation element 413 as distance operation means, and a range image generating element 415 as range image generating means. The parallax amount determining element 411 determines an amount of parallax of each of the imaging blocks, based on the outputs $Hp_{out}$ from each of the first integrating circuits 23 in the imaging devices 301, and the outputs $Vq_{out}$ from each of the second integrated circuits 33. At this point, the aforementioned Phase-only Correlation can be used. The distance operation element 413 operates a distance to the object 403 from each of the image blocks, based on the amounts of parallax determined in the parallax amount determining element 411. The range image generating element 415 forms a range image based on the distances operated in the distance operation element 413.

As described in the foregoing, the range image capture device 401 according to the present embodiment requires only an extremely small amount of data for capturing a range image in each of the imaging blocks (photosensitive region 10) included in each of the imaging device 301. Consequently, it is possible to maintain a low operation speed for capturing a range image, thereby achieving a lower electric current consumption and lower heat generation.

The present invention is not limited to the aforementioned embodiment. For example, instead of using a shift register, it is possible to connect each of the photosensitive portions $12_{mn}$ and $13_{mn}$ (second conductive type semiconductor regions 41 and 42) by uniform resistance wires. Thereafter, electric charges generated owing to incident light are obtained from an end of the resistance wire after resistive division of the electric charges is carried out so that the electric charges are inversely proportional to a distance between the end of each resistance wire and the position in the resistance wire into which the electric charges have been flown. Subsequently, a light incident position is obtained based on an electric current output from the end of each resistance wire.

Figure 20:
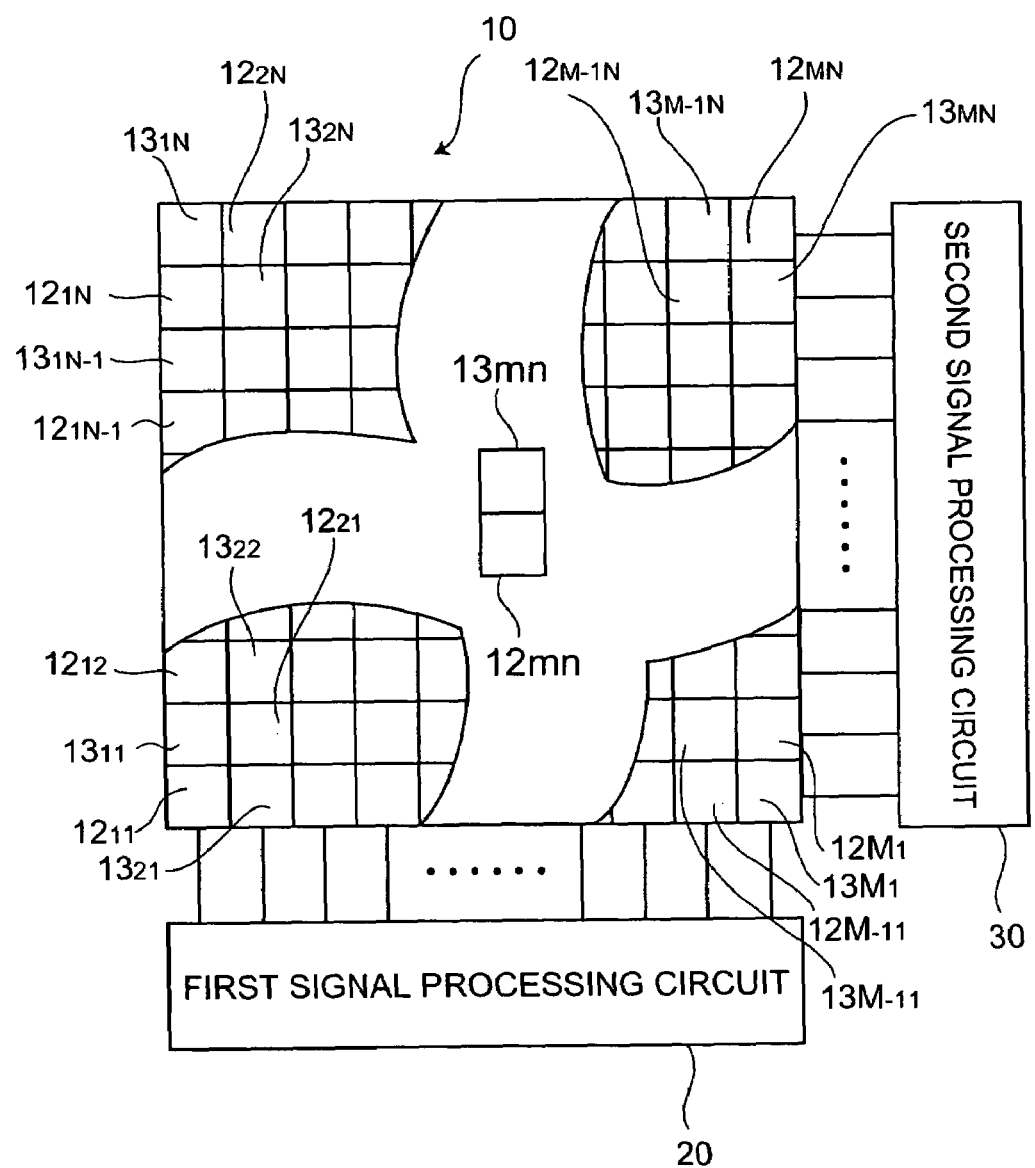
FIG. 20 is a conceptual diagram showing a configuration of a modification example of the photodetector according to the present embodiment.

Furthermore, although one pixel is configured by the plurality of photosensitive portions in the aforementioned embodiment, one pixel may be configured by one photosensitive portion. As shown in FIG. 20, for example, a photosensitive region 10 includes a plurality of first photosensitive portions $12_{mn}$ electrically connected to each other across the first direction, and a plurality of second photosensitive portions $13_{mn}$ electrically connected to each other across the second direction. The plurality of first photosensitive portions $12_{mn}$ and the plurality of second photosensitive portions $13_{mn}$ may be arrayed to be two-dimensionally mixed within one plane. In this case, the first and second photosensitive portions $12_{mn}$ and $13_{mn}$ are arrayed in a checkered pattern, and alternately arrayed in the first and second directions. It is also possible to array the first and second photosensitive portions $12_{mn}$ and $13_{mn}$ in a honeycomb structure as shown in FIG. 8, in stead of the checkered pattern.

INDUSTRIAL APPLICABILITY

The photodetector and the imaging device of the present invention can be applied for a range image capture device. Moreover, the range image capture device of the present invention can be applied for a part appearance inspection device and a part shape recognition device.

The invention claimed is:

1. A photodetector in which a photosensitive region has pixels in a two-dimensional array,
    wherein one pixel is configured by disposing a plurality of photosensitive portions adjacent to each other in one plane, each of the plurality of photosensitive portions outputting an electric current corresponding to an intensity of light incident on each of the photosensitive portions;
    the photosensitive portions on one side, amongst the plurality of photosensitive portions configuring each of the pixels, are electrically connected to each other by one wiring across the plurality of pixels arrayed in a first direction in the two-dimensional array, and the wiring electrically connected to the photosensitive portions on one side transmits the electric currents outputted from the photosensitive portions on one side in the first direction; and
    the photosensitive portions on the other side, amongst the plurality of photosensitive portions configuring each of the pixels, are electrically connected to each other by one wiring across the plurality of pixels arrayed in a second direction in the two-dimensional array, and the wiring electrically connected to the photosensitive portions on the other side transmits the electric currents outputted from the photosensitive portions on the other side in the second direction.

2. The photodetector according to claim 1, wherein each of the photosensitive portions includes a semiconductor substrate portion made of a first conductive type semiconductor, and a second conductive type semiconductor region formed in the semiconductor substrate portion, and
    the second conductive type semiconductor region is in a shape of an approximate triangle when viewed from a light incident direction, the approximate triangle being formed so that one side thereof is adjacent to one side of another approximate triangle in the pixel.

3. The photodetector according to claim 1,
wherein each of the photosensitive portions includes a semiconductor substrate portion made of a first conductive type semiconductor, and a second conductive type semiconductor region formed in the semiconductor substrate portion, and
the second conductive type semiconductor region is in a shape of an approximate rectangle when viewed from a light incident direction, the approximate rectangle being formed so that a long side thereof is adjacent to a long side of another approximate rectangle in the pixel.

4. The photodetector according to claim 1,
wherein the wiring is provided for electrically connecting the photosensitive portions on one side to each other across the plurality of pixels arrayed in the first direction, the wiring extending in the first direction between the pixels, and
the wiring is provided for electrically connecting the photosensitive portions on the other side to each other across the plurality of pixels arrayed in the second direction, the wiring extending in the second direction between the pixels.

5. The photodetector according to claim 1,
wherein each of the photosensitive portions includes a semiconductor substrate portion made of a first conductive type semiconductor, and a second conductive type semiconductor region formed in the semiconductor substrate portion;
the second conductive type semiconductor region is divided into four parts in one pixel, and the wiring for electrically connecting the photosensitive portions on one side to each other across the plurality of pixels arrayed in the first direction and the wiring for electrically connecting the photosensitive portions on the other side to each other across the plurality of pixels arrayed in the second direction are provided in boundaries between the divided parts; and
in the second conductive type semiconductor region divided into four parts in the pixel, the divided parts in a diagonal relationship are connected by the wiring.

6. The photodetector according to claim 1,
wherein each of the photosensitive portions includes a semiconductor substrate portion made of a first conductive type semiconductor, and a second conductive type semiconductor region formed in the semiconductor substrate portion, and
the second conductive type semiconductor region is in a shape of a polygon with four or more angles when viewed from a light incident direction, the polygon being formed so that one side thereof is adjacent to one side of another polygon in the pixel.

7. The photodetector according to claim 6,
wherein the second conductive type semiconductor region of the photosensitive portion on one side and the second conductive type semiconductor region of the photosensitive portion on the other side are placed in rows within one pixel in the third direction which intersects the first and second directions.

8. The photodetector according to claim 6, wherein the second conductive type semiconductor regions are arrayed in a honeycomb structure when viewed from the light incident direction.

9. The photodetector according to claim 1, further comprising:
a first shift register for sequentially reading electric currents in the second direction, the electric currents being from groups of the photosensitive portions on one side which are electrically connected across the plurality of pixels arrayed in the first direction;
a second shift register for sequentially reading electric currents in the first direction, the electric currents being from groups of the photosensitive portions on the other side which are electrically connected across the plurality of pixels arrayed in the second direction;
a first integrating circuit which sequentially inputs the electric currents from each of the groups of photosensitive portions on one side, the electric currents being sequentially read by the first shift register, and converts the electric currents into voltages; and
a second integrating circuit which sequentially inputs the electric currents from each of the groups of photosensitive portions on the other side, the electric currents being sequentially read by the second shift register, and converts the electric currents into voltages.

10. The photodetector according to claim 1, further comprising:
first integrating circuits which are provided corresponding to groups of the photosensitive portions on one side which are electrically connected across the plurality of pixels arrayed in the first direction, convert electric currents from the corresponding groups of the photosensitive portions on one side into voltages, and then output voltages;
first CDS circuits which are provided corresponding to the first integrating circuits, and output voltages with values defined according to variations in the voltages outputted from the corresponding first integrating circuits;
first sample-and-hold circuits which are provided corresponding to the first CDS circuits, and hold and output the voltages from the corresponding first CDS circuits;
a first maximum value detecting circuit which detects maximum values of the voltages from each of the first sample-and-hold circuits;
a first A/D conversion circuit which sequentially inputs the voltages from each of the first sample-and-hold circuits, converts the voltages into digital values based on the maximum values detected by the first maximum value detecting circuit, and outputs the digital values;
second integrating circuits which are provided corresponding to groups of the photosensitive portions on the other side which are electrically connected across the plurality of pixels arrayed in the second direction, convert electric currents from the corresponding groups of the photosensitive portions on the other side into voltages, and then output voltages;
second CDS circuits which are provided corresponding to the second integrating circuits, and output voltages with values defined according to variations in the voltages outputted from the corresponding second integrating circuits;
second sample-and-hold circuits which are provided corresponding to the second CDS circuits, and hold and output the voltages from the corresponding second CDS circuits;
a second maximum value detecting circuit which detects maximum values of the voltages from each of the second sample-and-hold circuits; and
a second A/D conversion circuit which sequentially inputs the voltages from each of the second sample-and-hold circuits, converts the voltages into digital values based on the maximum values detected by the second maximum value detecting circuit, and outputs the digital values.

11. A photodetector having photosensitive region,
wherein the photosensitive region includes a plurality of first photosensitive portions electrically connected to each other by one wiring across a first direction and a plurality of second photosensitive portions electrically connected to each other by one wiring across a second direction which intersects the first direction, and
the plurality of first photosensitive portions and the plurality of second photosensitive portions are arrayed to be two-dimensionally mixed within one plane,
wherein the wiring electrically connected to the plurality of first photosensitive portions transmits the electric currents outputted from the plurality of first photosensitive portions corresponding to an intensity of light incident in the first direction, and
the wiring electrically connected to the plurality of second photosensitive portions transmits electric currents outputted from the plurality of second photosensitive portions corresponding to an intensity of light incident in the second direction.

12. The photodetector according to claim 11, wherein the plurality of first photosensitive portions and the plurality of second photosensitive portions are alternately arrayed in any one of the first direction and the second direction.

13. The photodetector according to claim 11, wherein the plurality of first photosensitive portions and the plurality of second photosensitive portions are alternately arrayed in a third direction which intersects the first direction and the second direction.

14. The photodetector according to claim 13, wherein each of the photosensitive portions is arrayed in a honeycomb structure when viewed from a light incident direction.

15. The photodetector according to claim 11,
wherein each of the photosensitive portions includes a semiconductor substrate portion made of a first conductive type semiconductor, and a second conductive type semiconductor region formed in the semiconductor substrate portion, and
the second conductive type semiconductor region is in a shape of an approximate polygon when viewed from a light incident direction, the approximate polygon being formed so that one side thereof is adjacent to one side of another approximate polygon.

16. The photodetector according to claim 11,
wherein the wiring is provided for electrically connecting the first photosensitive portions to each other, the wiring extending in the first direction between the respective photosensitive portions, and
the wiring is provided for electrically connecting the second photosensitive portions to each other, the wiring extending in the second direction between the respective photosensitive portions.

17. The photodetector according to claim 11, further comprising:
a first shift register for sequentially reading electric currents in the second direction, the electric currents being from groups of the first photosensitive portions which are electrically connected to each other across the first direction;
a second shift register for sequentially reading electric currents in the first direction, the electric currents being from groups of the second photosensitive portions which are electrically connected to each other across the second direction;
a first integrating circuit which sequentially inputs the electric currents from each of the groups of first photosensitive portions, the electric currents being sequentially read by the first shift register, and converts the electric currents into voltages; and
a second integrating circuit which sequentially inputs the electric currents from each of the groups of second photosensitive portions, the electric currents being sequentially read by the second shift register, and converts the electric currents into voltages.

18. The photodetector according to claim 11, further comprising:
first integrating circuits which are provided corresponding to groups of the first photosensitive portions which are electrically connected to each other across the first direction, convert electric currents from the corresponding groups of the first photosensitive portions into voltages, and then output voltages;
first CDS circuits which are provided corresponding to the first integrating circuits, and output voltages with values defined according to variations in the voltages outputted from the corresponding first integrating circuits;
first sample-and-hold circuits which are provided corresponding to the first CDS circuits, and hold and output the voltages from the corresponding first CDS circuits;
a first maximum value detecting circuit which detects maximum values of the voltages from each of the first sample-and-hold circuits;
a first A/D conversion circuit which sequentially inputs the voltages from each of the first sample-and-hold circuits, converts the voltages into digital values based on the maximum values detected by the first maximum value detecting circuit, and outputs the digital values;
second integrating circuits which are provided corresponding to groups of the second photosensitive portions which are electrically connected to each other across the second direction, convert electric currents from the corresponding groups of the second photosensitive portions into voltages, and then output voltages;
second CDS circuits which are provided corresponding to the second integrating circuits, and output voltages with values defined according to variations in the voltages outputted from the corresponding second integrating circuits;
second sample-and-hold circuits which are provided corresponding to the second CDS circuits, and hold and output the voltages from the corresponding second CDS circuits;
a second maximum value detecting circuit which detects maximum values of the voltages from each of the second sample-and-hold circuits; and
a second A/D conversion circuit which sequentially inputs the voltages from each of the second sample-and-hold circuits, converts the voltages into digital values based on the maximum values detected by the second maximum value detecting circuit, and outputs the digital values.

19. An imaging device,
wherein the photodetectors according to any one of claims 1 and 11 are provided in a two-dimensional array.

20. The imaging device according to claim 19,
wherein each of groups of the photodetectors, having a plurality of the photodetectors arranged in the second direction in the two-dimensional array, further includes:

a first shift register for sequentially reading electric currents in the second direction, the electric currents being from groups of the photosensitive portions on one side which are electrically connected across the plurality of pixels arrayed in the first direction; and first integrating circuits which are provided for the respective groups of photodetectors having the plurality of photodetectors arranged in the second direction, and sequentially input the electric currents from each of the groups of photosensitive portions on one side, the electric currents being sequentially read by the first shift register, and convert the electric currents into voltages, and wherein each of groups of the photodetectors, having a plurality of the photodetectors arranged in the first direction in the two-dimensional array, further includes:

a second shift register for sequentially sensing electric currents in the first direction, the electric currents being from groups of the photosensitive portions on the other side which are electrically connected across the plurality of pixels arrayed in the second direction; and second integrating circuits which are provided for the respective groups of photodetectors having the plurality of photodetectors arranged in the first direction, and sequentially input the electric currents from each of the groups of photosensitive portions on the other side, the electric currents being sequentially read by the second shift register, and convert the electric currents into voltages.

21. A range image capture device, wherein a pair of the imaging devices according to claim 20 is arranged at a predetermined interval, the range image capture device comprising:

parallax amount determining means for determining an amount of parallax per each of the photodetectors based on the voltages from the first integrating circuits and the second integrating circuits;

distance operation means for operating a distance to an object from each of the photodetectors based on the amount of parallax determined by the parallax amount determining means; and range image generating means for generating a range image based on the distance operated by the distance operation means.

22. A photodetector in which a photosensitive region has pixels in a two-dimensional array, wherein one pixel is configured by disposing a plurality of photosensitive portions adjacent to each other in one plane, each of the plurality of photosensitive portions outputting an electric current corresponding to an intensity of light incident on each of the photosensitive portions;

the photosensitive portions on one side, amongst the plurality of photosensitive portions configuring each of the pixels, are electrically connected to each other by one wiring across the plurality of pixels arrayed in a first direction in the two-dimensional array; and the photosensitive portions on the other side, amongst the plurality of photosensitive portions configuring each of the pixels, are electrically connected to each other by one wiring across the plurality of pixels arrayed in a second direction in the two-dimensional array, wherein each of the photosensitive portions includes a semiconductor substrate portion made of a first conductive type semiconductor, and a second conductive type semiconductor region formed in the semiconductor substrate portion, and the second conductive type semiconductor region is in a shape of an approximate triangle when viewed from a light incident direction, the approximate triangle being formed so that one side thereof is adjacent to one side of another approximate triangle in the pixel.

23. A photodetector in which a photosensitive region has pixels in a two-dimensional array, wherein one pixel is configured by disposing a plurality of photosensitive portions adjacent to each other in one plane, each of the plurality of photosensitive portions outputting an electric current corresponding to an intensity of light incident on each of the photosensitive portions;

the photosensitive portions on one side, amongst the plurality of photosensitive portions configuring each of the pixels, are electrically connected to each other by one wiring across the plurality of pixels arrayed in a first direction in the two-dimensional array; and the photosensitive portions on the other side, amongst the plurality of photosensitive portions configuring each of the pixels, are electrically connected to each other by one wiring across the plurality of pixels arrayed in a second direction in the two-dimensional array, the photodetector further comprising:

first integrating circuits which are provided corresponding to groups of the photosensitive portions on one side which are electrically connected across the plurality of pixels arrayed in the first direction, convert electric currents from the corresponding groups of the photosensitive portions on one side into voltages, and then output voltages;

first CDS circuits which are provided corresponding to the first integrating circuits, and output voltages with values defined according to variations in the voltages outputted from the corresponding first integrating circuits;

first sample-and-hold circuits which are provided corresponding to the first CDS circuits, and hold and output the voltages from the corresponding first CDS circuits;

a first maximum value detecting circuit which detects maximum values of the voltages from each of the first sample-and-hold circuits;

a first A/D conversion circuit which sequentially inputs the voltages from each of the first sample-and-hold circuits, converts the voltages into digital values based on the maximum values detected by the first maximum value detecting circuit, and outputs the digital values;

second integrating circuits which are provided corresponding to groups of the photosensitive portions on the other side which are electrically connected across the plurality of pixels arrayed in the second direction, convert electric currents from the corresponding groups of the photosensitive portions on the other side into voltages, and then output voltages;

second CDS circuits which are provided corresponding to the second integrating circuits, and output voltages with values defined according to variations in the voltages outputted from the corresponding second integrating circuits;

second sample-and-hold circuits which are provided corresponding to the second CDS circuits, and hold and output the voltages from the corresponding second CDS circuits;

a second maximum value detecting circuit which detects maximum values of the voltages from each of the second sample-and-hold circuits; and a second A/D conversion circuit which sequentially inputs the voltages from each of the second sample-and-hold circuits, converts the voltages into digital values based on the maximum values detected by the second maximum value detecting circuit, and outputs the digital values.

24. A photodetector having photosensitive region,
wherein the photosensitive region includes a plurality of first photosensitive portions electrically connected to each other by one wiring across a first direction and a plurality of second photosensitive portions electrically connected to each other by one wiring across a second direction which intersects the first direction, and the plurality of first photosensitive portions and the plurality of second photosensitive portions are arrayed to be two-dimensionally mixed within one plane, the photodetector further comprising:

first integrating circuits which are provided corresponding to groups of the first photosensitive portions which are electrically connected to each other across the first direction, convert electric currents from the corresponding groups of the first photosensitive portions into voltages, and then output voltages;

first CDS circuits which are provided corresponding to the first integrating circuits, and output voltages with values defined according to variations in the voltages outputted from the corresponding first integrating circuits;

first sample-and-hold circuits which are provided corresponding to the first CDS circuits, and hold and output the voltages from the corresponding first CDS circuits;

a first maximum value detecting circuit which detects maximum values of the voltages from each of the first sample-and-hold circuits;

a first A/D conversion circuit which sequentially inputs the voltages from each of the first sample-and-hold circuits, converts the voltages into digital values based on the maximum values detected by the first maximum value detecting circuit, and outputs the digital values;

second integrating circuits which are provided corresponding to groups of the second photosensitive portions which are electrically connected to each other across the second direction, convert electric currents from the corresponding groups of the second photosensitive portions into voltages, and then output voltages;

second CDS circuits which are provided corresponding to the second integrating circuits, and output voltages with values defined according to variations in the voltages outputted from the corresponding second integrating circuits;

second sample-and-hold circuits which are provided corresponding to the second CDS circuits, and hold and output the voltages from the corresponding second CDS circuits;

a second maximum value detecting circuit which detects maximum values of the voltages from each of the second sample-and-hold circuits; and a second A/D conversion circuit which sequentially inputs the voltages from each of the second sample-and-hold circuits, converts the voltages into digital values based on the maximum values detected by the second maximum value detecting circuit, and outputs the digital values.

25. A range image capture device, comprising:

a pair of imaging devices arranged at a predetermined interval, each imaging device including a photodetector being provided in a two-dimensional array, the photodetector comprising:

a photosensitive region having pixels in a two-dimensional array, wherein one pixel is configured by disposing a plurality of photosensitive portions adjacent to each other in one plane, each of the plurality of photosensitive portions outputting an electric current corresponding to an intensity of light incident on each of the photosensitive portions;

the photosensitive portions on one side, amongst the plurality of photosensitive portions configuring each of the pixels, are electrically connected to each other by one wiring across the plurality of pixels arrayed in a first direction in the two-dimensional array; and the photosensitive portions on the other side, amongst the plurality of photosensitive portions configuring each of the pixels, are electrically connected to each other by one wiring across the plurality of pixels arrayed in a second direction in the two-dimensional array, wherein the photodetector, having a plurality of the photodetectors arranged in the second direction in the two-dimensional array, further includes:

a first shift register for sequentially reading electric currents in the second direction, the electric currents being from groups of the photosensitive portions on one side which are electrically connected across the plurality of pixels arrayed in the first direction; and first integrating circuits which are provided for the photodetector having the plurality of photodetectors arranged in the second direction, and sequentially input the electric currents from each of the groups of photosensitive portions on one side, the electric currents being sequentially read by the first shift register, and convert the electric currents into voltages, and wherein the photodetector, having a plurality of the photodetectors arranged in the first direction in the two-dimensional array, further includes:

a second shift register for sequentially sensing electric currents in the first direction, the electric currents being from groups of the photosensitive portions on the other side which are electrically connected across the plurality of pixels arrayed in the second direction; and second integrating circuits which are provided for the photodetector having the plurality of photodetectors arranged in the first direction, and sequentially input the electric currents from each of the groups of photosensitive portions on the other side, the electric currents being sequentially read by the second shift register, and convert the electric currents into voltages; the range image capture device further comprising:

parallax amount determining means for determining an amount of parallax per each of the photodetectors based on the voltages from the first integrating circuits and the second integrating circuits;

distance operation means for operating a distance to an object from each of the photodetectors based on the amount of parallax determined by the parallax amount determining means; and range image generating means for generating a range image based on the distance operated by the distance operation means.

26. A range image capture device, comprising:

a pair of imaging devices arranged at a predetermined interval, each imaging device including a photodetector being provided in a two-dimensional array, the photodetector comprising:

a photosensitive region, wherein the photosensitive region includes a plurality of first photosensitive portions electrically connected to each other by one wiring across a first direction and a plurality of second photosensitive portions electrically connected to each other by one wiring across a second direction which intersects the first direction, and the plurality of first photosensitive portions and the plurality of second photosensitive portions are arrayed to be two-dimensionally mixed within one plane, wherein the photodetector, having a plurality of the photodetectors arranged in the second direction in the two-dimensional array, further includes:

a first shift register for sequentially reading electric currents in the second direction, the electric currents being from groups of the photosensitive portions on one side which are electrically connected across the plurality of pixels arrayed in the first direction; and first integrating circuits which are provided for the photodetector having the plurality of photodetectors arranged in the second direction, and sequentially input the electric currents from each of the groups of photosensitive portions on one side, the electric currents being sequentially read by the first shift register, and convert the electric currents into voltages, and wherein the photodetector, having a plurality of the photo detectors arranged in the first direction in the two-dimensional array, further includes:

a second shift register for sequentially sensing electric currents in the first direction, the electric currents being from groups of the photosensitive portions on the other side which are electrically connected across the plurality of pixels arrayed in the second direction; and second integrating circuits which are provided for the photodetector having the plurality of photodetectors arranged in the first direction, and sequentially input the electric currents from each of the groups of photosensitive portions on the other side, the electric currents being sequentially read by the second shift register, and convert the electric currents into voltages;

the range image capture device further comprising:

parallax amount determining means for determining an amount of parallax per each of the photodetectors based on the voltages from the first integrating circuits and the second integrating circuits;

distance operation means for operating a distance to an object from each of the photodetectors based on the amount of parallax determined by the parallax amount determining means; and range image generating means for generating a range image based on the distance operated by the distance operation means.

* * * * *